(12) United States Patent
Kubo

(10) Patent No.: US 12,527,116 B2
(45) Date of Patent: Jan. 13, 2026

(54) METHOD FOR PRODUCING QUANTUM DOT LAYER AND METHOD FOR PRODUCING LIGHT EMITTING DEVICE

(71) Applicant: SHARP KABUSHIKI KAISHA, Sakai (JP)

(72) Inventor: Masumi Kubo, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 803 days.

(21) Appl. No.: 17/793,643

(22) PCT Filed: Feb. 6, 2020

(86) PCT No.: PCT/JP2020/004597
§ 371 (c)(1),
(2) Date: Jul. 18, 2022

(87) PCT Pub. No.: WO2021/157018
PCT Pub. Date: Aug. 12, 2021

(65) Prior Publication Data
US 2023/0058785 A1  Feb. 23, 2023

(51) Int. Cl.
*H10H 20/01* (2025.01)
*H10H 20/812* (2025.01)
(Continued)

(52) U.S. Cl.
CPC .............. *H10H 20/01* (2025.01); *B82Y 20/00* (2013.01); *B82Y 40/00* (2013.01); *H10H 20/032* (2025.01); *H10H 20/812* (2025.01)

(58) Field of Classification Search
CPC ..................................................... H10H 20/01
See application file for complete search history.

(56) References Cited

U.S. PATENT DOCUMENTS 10,954,440 B2 *  3/2021  Won ..................... H10K 50/115
12,065,604 B2 *  8/2024  Kwon ................... C09K 11/883
(Continued)

FOREIGN PATENT DOCUMENTS

JP          2017-025220 A      2/2017

OTHER PUBLICATIONS

Masami TANEMURA, "Random Packing (Physics on Form, Workshop Report)", Bussei Kenkyu (1984), 42 (1): 76-77, 1984-04-20.

*Primary Examiner* — William A Harriston
(74) *Attorney, Agent, or Firm* — ScienBiziP, P.C.

(57) ABSTRACT

A method for manufacturing a quantum dot layer includes: performing first application of applying, to a position overlapping with a substrate, a first solution including a plurality of particles including a core and a first ligand, a first inorganic precursor, and a first solvent; performing first heating of heating first solution to a first temperature or higher after the performing first application, the first temperature being a higher temperature of a melting point of the first ligand and a boiling point of the first solvent; and performing second heating of heating the first inorganic precursor to a second temperature after the performing first heating, the second temperature being higher than the first temperature and being a temperature, at which the first inorganic precursor epitaxially grows around the core and at which a first shell configured to coat the core is formed to form a plurality of first quantum dots.

14 Claims, 28 Drawing Sheets

(51) Int. Cl.
*B82Y 20/00* (2011.01)
*B82Y 40/00* (2011.01)

(56) References Cited

U.S. PATENT DOCUMENTS

| | | | | |
|---|---|---|---|---|
| 2006/0014315 | A1* | 1/2006 | Chan | C09K 11/883 438/99 |
| 2009/0109435 | A1* | 4/2009 | Kahen | C09K 11/883 313/503 |
| 2009/0321692 | A1* | 12/2009 | LoCascio | C09K 11/661 252/500 |
| 2010/0316797 | A1* | 12/2010 | Ying | B82Y 5/00 427/216 |
| 2014/0022779 | A1* | 1/2014 | Su | C09K 11/02 362/231 |
| 2016/0161066 | A1* | 6/2016 | Sung | H10H 20/8512 252/301.36 |
| 2019/0276737 | A1* | 9/2019 | Won | C09K 11/883 |
| 2020/0165517 | A1* | 5/2020 | Lee | H10K 50/115 |
| 2021/0066543 | A1* | 3/2021 | Han | C09K 11/883 |
| 2021/0115332 | A1* | 4/2021 | Kim | H10K 50/115 |
| 2022/0119706 | A1* | 4/2022 | Kwon | G02F 1/133617 |
| 2022/0131049 | A1* | 4/2022 | Kubo | H10H 20/835 |

* cited by examiner

METHOD FOR PRODUCING QUANTUM DOT LAYER AND METHOD FOR PRODUCING LIGHT EMITTING DEVICE

TECHNICAL FIELD

The disclosure relates to a method for manufacturing a quantum dot layer and a method for manufacturing a light-emitting device.

BACKGROUND ART

PTL 1 discloses a semiconductor nanoparticle (quantum dot) having a core/shell structure and a ligand that coordinates with the semiconductor nanoparticle.

CITATION LIST

Patent Literature

PTL 1: JP 2017-025220 A

Non Patent Literature

NPL 1: Tanemura Masami, "Random Packing (Physics on Form, Workshop Report)", Bussei Kenkyu (1984), 42 (1), 76-77

SUMMARY

Technical Problem

An improvement in luminous efficiency is desired in a quantum dot layer.

Solution to Problem

In order to solve the problem described above, a method for manufacturing a quantum dot layer according to the disclosure includes: performing first application of applying, to a position overlapping with a substrate, a first solution including a plurality of particles including a core and a first ligand coordinating with the core, a first inorganic precursor, and a first solvent; performing first heating of heating the first ligand and the first solvent to a first temperature or higher after the performing first application, the first temperature being a higher temperature of a melting point of the first ligand and a boiling point of the first solvent; and performing second heating of heating the first inorganic precursor to a second temperature after the performing first heating, the second temperature being higher than the first temperature and being a temperature, at which the first inorganic precursor epitaxially grows around the core and at which a first shell configured to coat the core is formed to form a plurality of first quantum dots.

Advantageous Effects of Disclosure

According to the configuration described above, luminous efficiency of a quantum dot layer can be improved.

DESCRIPTION OF EMBODIMENTS

First Embodiment

Figure 1A:
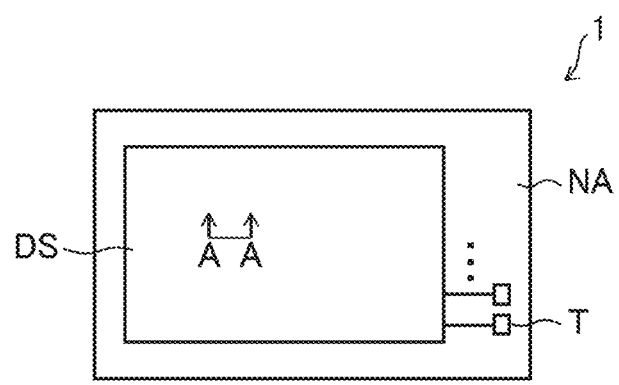
FIG. 1A is a schematic top view of a light-emitting device according to a first embodiment.
Figure 1B:
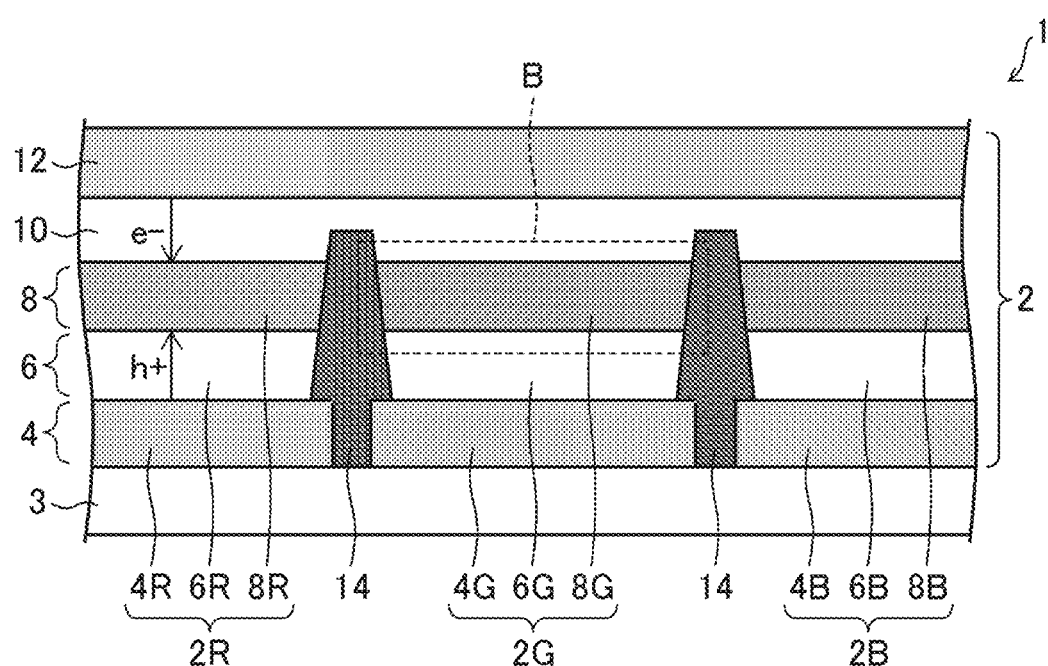
FIG. 1B is a cross-sectional view taken along a line A-A in FIG. 1A.
Figure 1C:
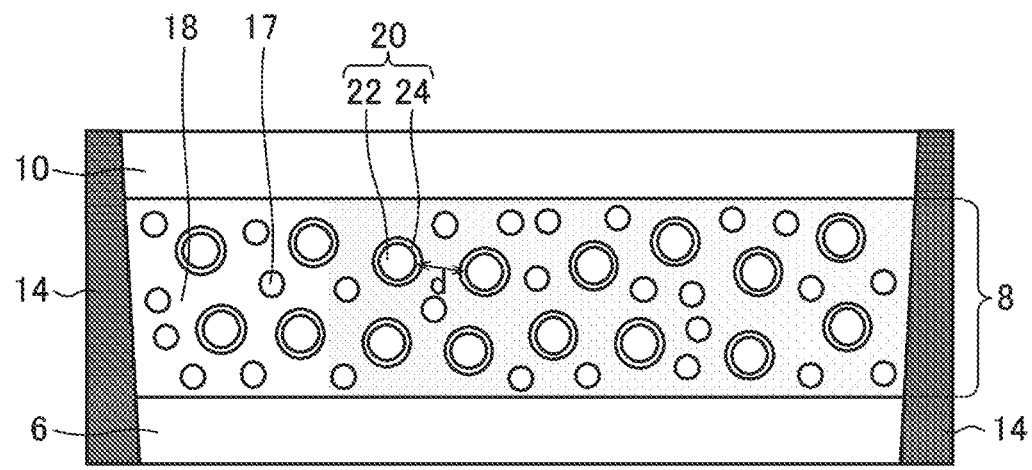
FIG. 1C is an enlarged cross-sectional view of a region B in FIG. 1B.

FIG. 1A is a schematic top view of a light-emitting device 1 according to the present embodiment. FIG. 1B is a cross-sectional view taken along a line A-A in FIG. 1A. FIG. 1C is an enlarged cross-sectional view of a region B in FIG. 1B, that is, an enlarged cross-sectional view of a perimeter of a second light-emitting layer 8G to be described later.

As illustrated in FIG. 1A, the light-emitting device 1 according to the present embodiment includes a light-emitting face DS from which light emission is extracted and a frame region NA surrounding a periphery of the light-emitting face DS. In the frame region NA, a terminal T may be formed into which a signal for driving a light-emitting element of the light-emitting device 1 described in detail later is input.

At a position overlapping with the light-emitting face DS in plan view, as illustrated in FIG. 1B, the light-emitting device 1 according to the present embodiment includes a light-emitting element layer 2 and an array substrate 3. The light-emitting device 1 has a structure in which respective layers of the light-emitting element layer 2 are layered on the array substrate 3, in which a thin film transistor (TFT; not illustrated) is formed. In the present specification, a direction from the light-emitting element layer 2 to the array substrate 3 of the light-emitting device 1 is referred to as "downward direction", and a direction from the light-emitting element layer 2 to the light-emitting face DS of the light-emitting device 1 is referred to as "upward direction".

The light-emitting element layer 2 includes, on a first electrode 4, a first charge transport layer 6, a light-emitting layer 8 as a quantum dot layer, a second charge transport layer 10, and a second electrode 12, which are sequentially layered from the lower layer. The first electrode 4 of the light-emitting element layer 2 formed in the upper layer of the array substrate 3 is electrically connected to the TFT of the array substrate 3. In the present embodiment, the first electrode 4 is an anode electrode and the second electrode 12 is a cathode electrode, for example.

In the present embodiment, the light-emitting element layer 2 includes a first light-emitting element 2R, a second light-emitting element 2G, and a third light-emitting element 2B. The first light-emitting element 2R, the second light-emitting element 2G, and the third light-emitting element 2B are quantum-dot light emitting diode (QLED) elements in which the light-emitting layer 8 includes a semiconductor nanoparticle material, that is, a quantum dot material. That is, the light-emitting layer 8 is a quantum dot layer including a plurality of quantum dots. The first light-emitting element 2R, the second light-emitting element 2G, and the third light-emitting element 2B cause quantum dots to perform electro-luminescence (EL) light emission in the light-emitting layer 8.

Each of the first electrode 4, the first charge transport layer 6, and the light-emitting layer 8 is separated by edge covers 14. In particular, in the present embodiment, the first electrode 4 is, by the edge covers 14, separated into a first electrode 4R for the first light-emitting element 2R, a first electrode 4G for the second light-emitting element 2G, and a first electrode 4B for the third light-emitting element 2B. The first charge transport layer 6 is, by the edge covers 14, separated into a first charge transport layer 6R for the first light-emitting element 2R, a first charge transport layer 6G for the second light-emitting element 2G, and a first charge transport layer 6B for the third light-emitting element 2B.

Further, the light-emitting layer 8 is, by the edge covers 14, separated into a first light-emitting layer 8R, the second light-emitting layer 8G, and a third light-emitting layer 8B.

The second charge transport layer 10 and the second electrode 12 are not separated by the edge covers 14, and are each formed in a shared manner. As illustrated in FIG. 1B, the edge covers 14 may be formed at the positions to cover side surfaces of the first electrode 4 and the vicinity of peripheral end portions of an upper face thereof.

In the present embodiment, the first light-emitting element 2R includes the first electrode 4R, the first charge transport layer 6R, the first light-emitting layer 8R, the second charge transport layer 10, and the second electrode 12. The second light-emitting element 2G includes the first electrode 4G, the first charge transport layer 6G, the second light-emitting layer 8G, the second charge transport layer 10, and the second electrode 12. Furthermore, the third light-emitting element 2B includes the first electrode 4B, the first charge transport layer 6B, the third light-emitting layer 8B, the second charge transport layer 10, and the second electrode 12.

In the present embodiment, the first light-emitting layer 8R emits red light that is light of a first color, the second light-emitting layer 8G emits green light that is light of a second color, and the third light-emitting layer 8B emits blue light that is light of a third color. In other words, the first light-emitting element 2R, the second light-emitting element 2G, and the third light-emitting element 2B are light-emitting elements that emit light of colors different from each other. The first light-emitting layer 8R is a quantum dot layer including a plurality of quantum dots that emit red light. The second light-emitting layer 8G is a quantum dot layer including a plurality of quantum dots that emit green light. The third light-emitting layer 8B is a quantum dot layer including a plurality of quantum dots that emit blue light.

Here, the blue light refers to, for example, light having a light emission central wavelength in a wavelength band of equal to or greater than 400 nm and equal to or less than 500 nm. The green light refers to, for example, light having a light emission central wavelength in a wavelength band of greater than 500 nm and equal to or less than 600 nm. The red light refers to, for example, light having a light emission central wavelength in a wavelength band of greater than 600 nm and equal to or less than 780 nm.

The first electrode 4 and the second electrode 12 include conductive materials and are electrically connected to the first charge transport layer 6 and the second charge transport layer 10, respectively. Of the first electrode 4 and the second electrode 12, the electrode closer to the light-emitting face DS is a transparent electrode.

In particular, in the present embodiment, the array substrate 3 is a transparent substrate, and the first electrode 4 is a transparent electrode. The second electrode 12 may be a reflective electrode. Therefore, light from the light-emitting layer 8 passes through the first charge transport layer 6, the first electrode 4, and the array substrate 3, and is emitted from the light-emitting face DS to the outside of the light-emitting device 1. Due to this, the light-emitting device 1 is configured as a bottom-emitting type light-emitting device. Since both the light emitted in the upward direction from the light-emitting layer 8 and the light emitted in the downward direction from the light-emitting layer 8 are available as light emission from the light-emitting device 1, the light-emitting device 1 can improve the usage efficiency of the light emitted from the light-emitting layer 8.

Note that the configuration of the first electrode 4 and the second electrode 12 described above is an example, and may be configured with other materials.

The first charge transport layer 6 is a layer that transports charges from the first electrode 4 to the light-emitting layer 8. The first charge transport layer 6 may have a function of inhibiting the transport of charges from the second electrode 12. In the present embodiment, the first charge transport layer 6 may be a hole transport layer that transports positive holes from the first electrode 4, which is an anode electrode, to the light-emitting layer 8.

The second charge transport layer 10 is a layer that transports the charge from the second electrode 12 to the light-emitting layer 8. The second charge transport layer 10 may have a function of inhibiting the transport of the charges from the first electrode 4.

In the present embodiment, the second charge transport layer 10 may be an electron transport layer that transports electrons from the second electrode 12, which is a cathode electrode, to the light-emitting layer 8.

Next, the configuration of the light-emitting layer 8 will be described in detail with reference to FIG. 1C. FIG. 1C is a schematic cross-sectional view of the region B in FIG. 1B, that is, a schematic cross-sectional view of the periphery of the second light-emitting layer 8G of the second light-emitting element 2G. Note that, in the present embodiment, unless otherwise indicated, members illustrated in FIG. 1C are considered to have configurations common to each of the light-emitting elements. Accordingly, in the present embodiment, unless otherwise indicated, the members illustrated in FIG. 1C may have the same configurations as those in each of the light-emitting elements.

In the present embodiment, the light-emitting layer 8 includes a first quantum dot 20, a second quantum dot 17, and a ligand (first ligand) 18. The first quantum dot 20 has a core/shell structure including a core 22 and a first shell 24, with which the periphery of the core 22 is coated. For example, the first shell 24 is an outer shell of the core 22, and is formed by epitaxially growing on the core 22.

The first quantum dot 20 may have a multi-shell structure in which a plurality of shells are provided around the core 22. In this case, the first shell 24 refers to a shell corresponding to the outermost layer among the plurality of shells.

The ligand 18 may coordinate with the first quantum dot 20 on an outer surface of the first shell 24 to fill a void in the first quantum dot 20. Further, the ligand 18 also coordinates with the second quantum dot 17 on an outer surface of the second quantum dot 17. The ligand 18 may be, for example, trioctylphosphine oxide (TOPO).

As illustrated in FIG. 1C, in the present embodiment, the ligand 18 is interposed between adjacent first quantum dots 20. That is, adjacent first quantum dots 20 are separated from each other. Note that, among the first quantum dots 20, at least one set of first quantum dots 20 adjacent to each other may be connected to each other via the first shell 24. The first shell 24 has a crystal structure, and has a crystal structure formed by epitaxially growing on the core 22. In the present embodiment, all the first quantum dots 20 within the same light-emitting element may be connected to each other by the crystal structure of the first shell 24 to form an integral quantum dot structure. The first shell 24 may be polycrystalline.

The core 22 and the first shell 24 of the first quantum dot 20 may include an inorganic material used for the quantum dots of a known core/shell structure. In other words, the first light-emitting layer 8R, the second light-emitting layer 8G, and the third light-emitting layer 8B may include known quantum dot materials used for light-emitting layers of red, green, and blue QLED elements, respectively.

Examples of specific materials for the core 22 include group II-VI semiconductors such as CdSe (band gap 1.73 eV), CdTe (band gap 1.44 eV), ZnTe (band gap 2.25 eV), and CdS (band gap 2.42 eV). Examples of other specific materials for the core 22 include group III-V semiconductors such as InP (band gap 1.35 eV) and InGaP (band gap 1.88 eV).

In general, a wavelength of light emitted by the quantum dot is determined by the particle diameter of the core. Therefore, it is preferable to employ a semiconductor material having an appropriate band gap as a material of the core 22 in order to control the light emitted from the core 22 to be any of red, green, and blue colors, by controlling the particle diameter of the core 22.

The band gap of the material of the core 22 included in the first light-emitting layer 8R is preferably equal to or lower than 1.97 eV in order for the first light-emitting layer 8R serving as a red light-emitting layer to emit red light having a wavelength of 630 nm. In order for the second light-emitting layer 8G serving as a green light-emitting layer to emit green light having a wavelength of 532 nm, the band gap of the material of the core 22 included in the second light-emitting layer 8G is preferably equal to or lower than 2.33 eV. Furthermore, in order for the third light-emitting layer 8B serving as a blue light-emitting layer to emit blue light having a wavelength of 630 nm, the band gap of the material of the core 22 included in the third light-emitting layer 8B is preferably equal to or lower than 2.66 eV. The light-emitting device 1 provided with the first light-emitting layer 8R, the second light-emitting layer 8G, and the third light-emitting layer 8B is preferable from the perspective of satisfying the color space criteria in the International Standard BT 2020 of UHDTV.

Examples of specific materials for the first shell 24 include group II-VI semiconductors such as ZnSe (band gap 2.7 eV) and ZnS (band gap 3.6 eV). Further, examples of specific materials for the first shell 24 and the second shell 26 include group III-V semiconductors such as GaP (band gap 2.26 eV).

The material of the core 22 preferably has low specific resistance and a small band gap compared to the material of the first shell 24. With this configuration, the efficiency of charge injection from the first shell 24 to the core 22 is improved.

As illustrated in FIG. 1C, the shortest distance from the core 22 of one first quantum dot 20 to the core 22 of another first quantum dot 20 adjacent thereto is defined as d. For example, when the core 22 is made of InP, and the first shell 24 is made of ZnS, an average value of the distance d is preferably equal to or greater than 3 nm. For example, when the core 22 is made of CdSe, and the first shell 24 is made of ZnS, an average value of the distance d is preferably equal to or greater than 1 nm. With this configuration, the electron exudation from the core 22, derived from the electron wave function, may be efficiently reduced by the first shell 24.

The second quantum dot 17 is formed of the same material as the first shell 24. A part of the charge injected into the light-emitting layer 8 is injected into the first quantum dot 20 via the second quantum dot 17. Thus, the charge injected into the light-emitting layer 8 is easily injected into the first quantum dot 20. As a result, the luminous efficiency of the light-emitting layer 8 can be improved. That is, the luminous efficiency in the light-emitting device 1 can be improved.

The second quantum dot 17 is preferably formed by using a semiconductor material having a band gap of equal to or greater than 3.1 eV. Further, when the second quantum dot 17 is formed by using a semiconductor material having a band gap of less than 3.1 eV, the second quantum dot 17 preferably has a particle diameter having a light emission wavelength of equal to or less than 400 nm. In this way, the second quantum dot 17 emits ultraviolet light having a light emission wavelength of less than 400 nm, and thus a decrease in color purity of the luminescent color of the light-emitting layer 8 due to the luminescent color of the second quantum dot 17 can be suppressed. Examples of the semiconductor material having a band gap of equal to or greater than 3.1 eV include ZnS:Eg=3.6 eV, ZnO:Eg=3.37 eV, CuCl:Eg=3.2 eV, and the like. When the second quantum dot 17 is formed by CdS:Eg=2.4 eV, the second quantum dot 17 preferably has a particle diameter (diameter) of equal to or less than 2 nm.

When the second quantum dot 17 emits ultraviolet light, an ultraviolet light cut filter that absorbs a wavelength band of ultraviolet light may be provided above the light-emitting layer 8. In this way, a decrease in color purity of the luminescent color of the light-emitting layer 8 due to the luminescent color of the second quantum dot 17 can be further suppressed.

Figure 2:
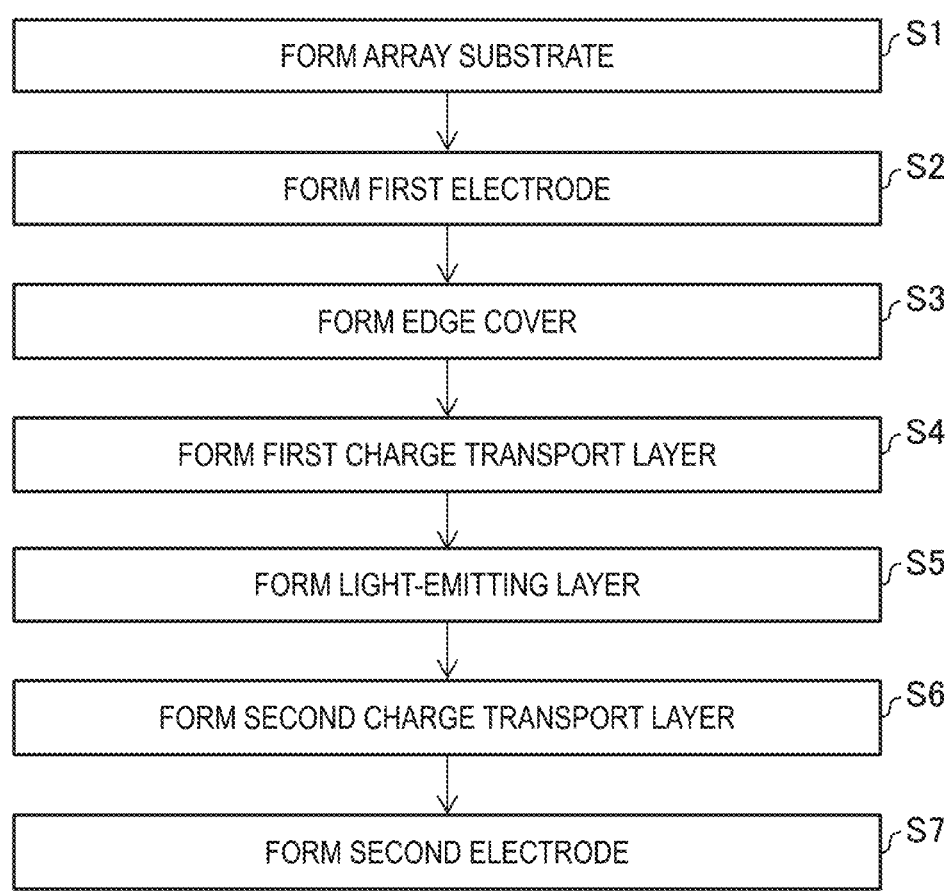
FIG. 2 is a flowchart for describing a method for manufacturing the light-emitting device according to the first embodiment.

Next, a method for manufacturing the light-emitting device 1 according to the present embodiment will be described with reference to FIG. 2. FIG. 2 is a flowchart for describing the method for manufacturing the light-emitting device 1 according to the present embodiment.

First, the array substrate 3 is formed (step S1). Formation of the array substrate 3 may be performed by forming a plurality of TFTs on the substrate to match positions of the subpixels.

Next, the first electrode 4 is formed (step S2). In step S2, for example, after a transparent electrode material having electrical conductivity, such as ITO, is film-formed by sputtering, the first electrode 4 may be formed for each subpixel by patterning while matching a shape of the subpixel. Alternatively, the first electrode 4 may be formed for each subpixel by vapor-depositing a transparent electrode material by using a vapor deposition mask.

Next, the edge covers 14 are formed (step S3). The edge covers 14, after being applied on the array substrate 3 and the first electrode 4, may be obtained by patterning while leaving the positions covering the side surfaces and peripheral end portions of the first electrodes 4 between the adjacent first electrodes 4. The patterning of the edge covers 14 may be performed by photolithography.

Next, the first charge transport layer 6 is formed (step S4). The first charge transport layer 6 may be formed for each subpixel by separately patterning with an ink-jet method, vapor deposition using a mask, or patterning using photolithography.

Next, the light-emitting layer 8 is formed (step S5). The step of forming the light-emitting layer 8 will be described in more detail with reference to FIGS. 3 to 6B.

Figure 3:
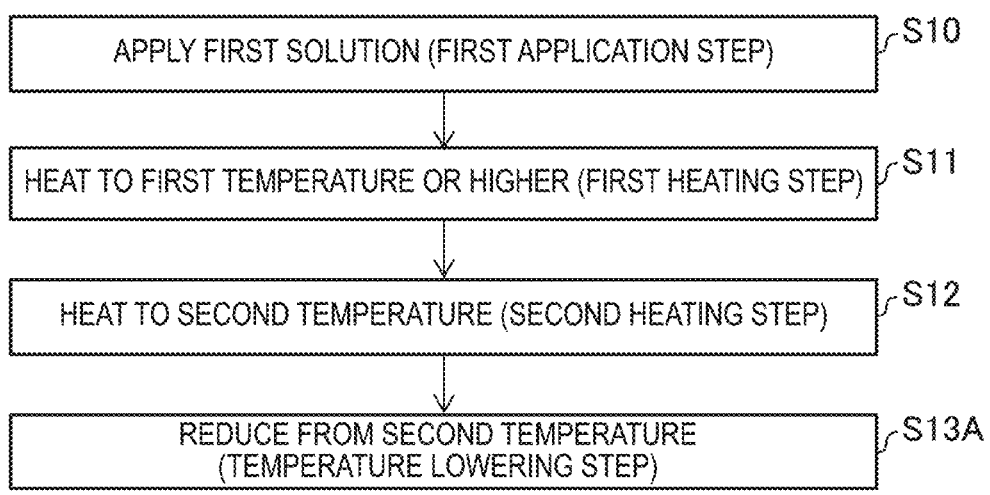
FIG. 3 is a flowchart for describing a step for forming a light-emitting layer according to the first embodiment.

FIG. 3 is a flowchart for describing the step of forming the light-emitting layer corresponding to a step of forming a quantum dot layer in the present embodiment.

Figure 4:
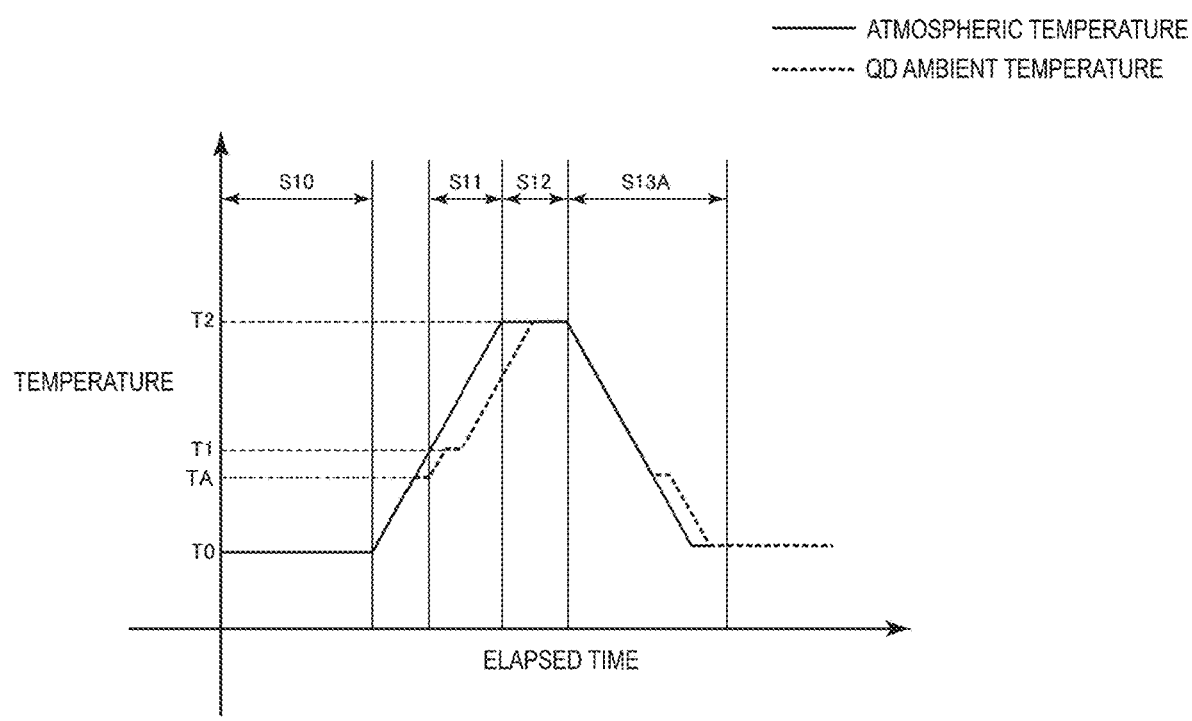
FIG. 4 is a graph for describing a relationship between an elapsed time and a temperature in a step of forming the light-emitting layer according to the first embodiment.

FIG. 4 is a graph for describing a relationship between an elapsed time and a temperature in the step of forming the light-emitting layer. In FIG. 4, the horizontal axis represents the elapsed time of the step of forming the light-emitting layer, and the vertical axis represents the temperature. A solid line in FIG. 4 indicates a temperature of the atmosphere around the array substrate 3, a broken line indicates a temperature around the first quantum dots 20 on the array substrate 3, and a dotted line indicates a temperature of the ligand 18 except for the ligand 18 disposed around the first quantum dots 20.

Hereinafter, the term "atmosphere" simply indicates the atmosphere around the array substrate 3.

FIGS. 5A, 5B, 6A, and 6B are diagrams (forming-step cross-sectional views) for describing the step of forming the light-emitting layer. Hereinafter, each of the forming-step cross-sectional views including FIGS. 5A, 5B, 6A, and 6B of the present specification illustrates the forming-step cross-sectional view of the region B in FIG. 1B, that is, the forming-step cross-sectional view at the position corresponding to the periphery of the second light-emitting layer 8G of the second light-emitting element 2G. However, the techniques described with reference to the forming-step cross-sectional views in the present specification may be applied to the method for forming the light-emitting layer 8 of the other light-emitting elements, unless otherwise specified.

Figure 5A:
FIG. 5A is a cross-sectional view of a substrate before the light-emitting layer according to the first embodiment is formed.

As illustrated in FIG. 5A, the formation up to the first charge transport layer 6 has been performed on the array substrate 3 until the step of forming the light-emitting layer. In the step of forming the light-emitting layer, first, a step of first application is performed in which a first solution 28 illustrated in FIG. 5B is applied on a position overlapping with the array substrate 3 (step S10).

Figure 5B:
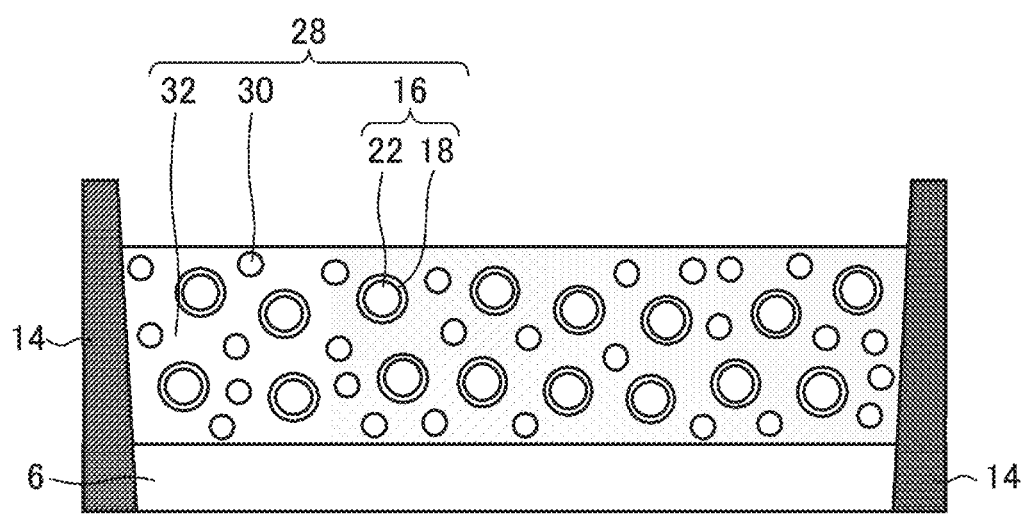
FIG. 5B is a cross-sectional view of the substrate in FIG. 5A after a first solution is applied.

The first solution 28 is a solution in which a plurality of particles 16 including the core 22 and the ligand 18 coordinating with the core 22 and a first inorganic precursor 30 are dispersed in a first solvent 32, as illustrated in FIG. 5B. The first solvent 32 may be, for example, hexane. The first inorganic precursor 30 contains the same material as the first shell 24 described above. The first inorganic precursor 30 may contain, for example, zinc chloride and 1-Dodecanethiol.

The step of the first application is performed at an atmospheric temperature of a temperature T0, as illustrated in FIG. 4. Since the application of the first solution 28 is performed at the atmospheric temperature of the temperature T0, an ambient temperature of the particles 16 in the first solution 28 to be applied also takes the temperature T0, as illustrated in FIG. 4. The temperature T0 may be, for example, an ordinary temperature.

Next, the array substrate 3, on which the first solution 28 is applied, is set in a furnace or the like, and heating of the atmosphere is started. Here, a step of first heating is performed by heating the atmosphere until the atmospheric temperature becomes equal to or higher than a first temperature T1 indicated in FIG. 4 (step S11). Note that the step of heating the array substrate 3 (such as the step of the first heating) may be performed by irradiating the array substrate 3 with light such as ultraviolet light. In the step of the first heating, the first solvent 32 is irradiated with light, and thus the core 22 absorbs light, and the core 22 in the first solvent 32 locally generates heat. Then, the core 22 generates heat, and thus the ligand 18 around the core 22 is also heated.

The first temperature T1 is the higher temperature of the melting point of the ligand 18 and the boiling point of the first solvent 32. A temperature TA indicated in FIG. 4 is the lower temperature of the melting point of the ligand 18 and the boiling point of the first solvent 32. The first temperature T1 and the temperature TA are higher than the temperature T0. Note that the temperature TA may be the boiling point of the first solvent 32, and the first temperature T1 may be the melting point of the ligand 18.

The melting point of TOPO is in a range from 50 degrees Celsius to 54 degrees Celsius, and the boiling point of hexane is in a range from 68.5 degrees Celsius to 69.1 degrees Celsius. Accordingly, in a case where the ligand 18 is TOPO and the first solvent 32 is hexane, the temperature TA is the melting point of the TOPO, and the first temperature T1 is the boiling point of the hexane.

The ambient temperature of the particles 16 follows a rise of the atmospheric temperature, as illustrated in FIG. 4, until the atmospheric temperature rises from the temperature T0 to the temperature TA. However, when the ambient temperature of the particles 16 rises up to the temperature TA and one of the melting of the ligand 18 and the evaporation of the first solvent 32 begins, the ambient temperature of the particles 16 maintains the temperature TA for a while.

By further carrying on the heating of the atmosphere, one of the melting of the ligand 18 and the evaporation of the first solvent 32 ends, and the ambient temperature of the particles 16 begins to rise again. Then, when the ambient temperature of the particles 16 rises up to the first temperature T1 and the other one of the melting of the ligand 18 and the evaporation of the first solvent 32 begins, the ambient temperature of the particles 16 maintains the first temperature T1 for a while.

Thus, the melting of the ligand 18 and the evaporation of the first solvent 32 are completed by the step of the first heating. When the first temperature T1 is the boiling point of the first solvent 32, in the step of the first heating, the first solvent 32 vaporizes after the ligand 18 has melted. On the other hand, when the first temperature T1 is the melting point of the ligand 18, in the step of the first heating, the ligand 18 melts after the first solvent 32 has vaporized.

In a case where the melting of the ligand 18 is earlier than the vaporization of the first solvent 32, immediately after the vaporization of the first solvent 32, aggregate of the cores 22 is formed in an upper layer relative to the first charge transport layer 6. Since the aggregate is unstable as a film, it is difficult for the first inorganic precursor 30 to be present in some case. Accordingly, in the step of the first heating, from the perspective of forming a stable film including the particles 16 and the first inorganic precursor 30, it is preferable that the first solvent 32 vaporizes after the melting of the ligand 18.

Figure 6A:
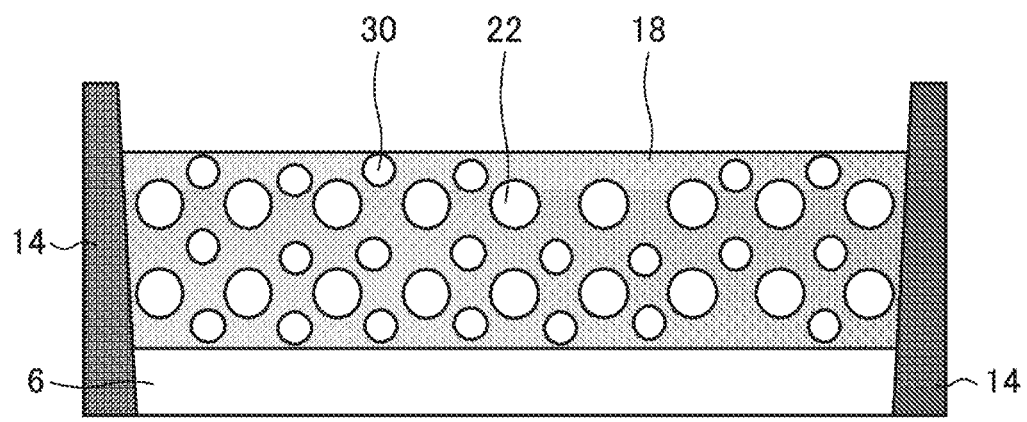
FIG. 6A is a cross-sectional view of the substrate in which a solvent of the first solution in FIG. 5B is vaporized.

After the completion of the step of the first heating, as illustrated in FIG. 6A, the first solvent 32 has vaporized from above the array substrate 3, and the cores 22 and the first inorganic precursor 30 are dispersed in the melted ligand 18.

Subsequently, the heating of the atmosphere is continued until the atmospheric temperature reaches a second temperature T2 indicated in FIG. 4. From the point in time when the atmospheric temperature reaches the second temperature T2, a step of second heating is performed in which heating conditions are adjusted to maintain the atmospheric temperature at approximately the second temperature T2 (step S12).

After the completion of the melting of the ligand 18 and the evaporation of the first solvent 32, the ambient temperature of the cores 22 rises from the first temperature T1 and reaches the second temperature T2. Since the atmospheric temperature is maintained at the second temperature T2, the ambient temperature of the cores 22 having reached the second temperature T2 is also maintained at the second temperature T2.

Figure 6B:
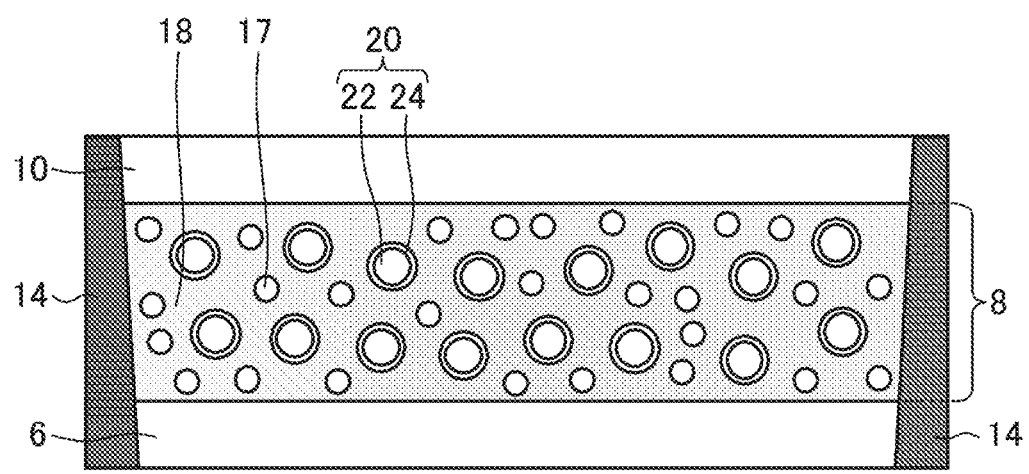
FIG. 6B is a cross-sectional view of the substrate on which the light-emitting layer according to the first embodiment is formed.

The second temperature T2 is higher than the first temperature T1, and is a temperature at which the first inorganic precursor 30 epitaxially grows around the cores 22 by thermochemical reaction. Thus, while the ambient temperature of the cores 22 is maintained at the second temperature T2, the first inorganic precursor 30 gradually grows epitaxially around the cores 22. With this, the first shell 24 is formed around each of the cores 22, as illustrated in FIG. 6B. Further, the first inorganic precursor 30 remaining in the ligand 18 becomes the second quantum dot 17 made of the same material as the first shell 24 in the ligand 18. That is, the second quantum dot 17 is formed of the first inorganic precursor 30. When the first inorganic precursor 30 contains zinc chloride and 1-Dodecanethiol as discussed above, the second temperature T2 is approximately 200 degrees Celsius.

As described above, as illustrated in FIG. 6B, the first quantum dot 20 including the core 22 and the first shell 24 is formed. Then, after the atmospheric temperature has reached a temperature at approximately the second temperature T2 (step S12), a step of temperature lowering (second temperature lowering step) is performed in which the atmospheric temperature is reduced from the second temperature T2 (step S13A). In the step of the temperature lowering, for example, the array substrate 3 is removed from the furnace and cooled. In this way, the melted ligand 18 is solidified again, and the ligand 18 is formed in a layered manner. Then, the light-emitting layer 8 illustrated in FIG. 6B including the first quantum dot 20, the second quantum dot 17, and the ligand 18 is obtained. The second quantum dot 17 contains, in the core, the same material as the first shell 24. For example, the second quantum dot 17 is not a quantum dot (quantum dot of a core-shell type) including a shell epitaxially growing around a core, and is a quantum dot (quantum dot of a core type) that does not include a shell epitaxially growing around a core and is substantially formed of only a core.

When the period (the period in step S12) for maintaining the atmospheric temperature at the second temperature T2 is increased, a decrease in luminous efficiency may be caused by adjacent first quantum dots 20 connected to each other, or the first quantum dot 20 and the second quantum dot 17 connected to each other. Thus, the period (the period in step S12) for maintaining the atmospheric temperature at the second temperature T2 is preferably a period of time as short as possible. For example, the step of the temperature lowering may be started so as to reduce a temperature from the second temperature T2 while the first inorganic precursor 30 is epitaxially growing around the core 22 after the step of the second heating. In this way, adjacent first quantum dots 20 can be separated from each other. That is, a state where adjacent first quantum dots 20 are not connected to each other via the first shell 24 can be obtained. Further, the first quantum dot 20 and the second quantum dot 17 can be separated from each other. That is, a state where the first quantum dot 20 is not connected to the second quantum dot 17 via the first shell 24 can be obtained. In this way, a decrease in luminous efficiency due to adjacent first quantum dots 20 connected to each other, or the first quantum dot 20 and the second quantum dot 17 connected to each other can be suppressed.

Further, for example, when the second quantum dot 17 is formed by using a semiconductor material having a band gap of less than 3.1 eV (for example, CdS:Eg=2.4 eV), the period (the period in step S12) for maintaining the atmospheric temperature at the second temperature T2 is preferably adjusted such that a particle diameter (diameter) is equal to or less than 2 nm. In this way, a decrease in color purity of the luminescent color of the light-emitting layer 8 due to the luminescent color of the second quantum dot 17 can be suppressed.

Note that in the present embodiment, the step of forming the light-emitting layer 8 is described with reference to the enlarged cross-sectional view of the periphery of the second light-emitting layer 8G. However, a difference in the forming method of each of the first light-emitting layer 8R, second light-emitting layer 8G, and third light-emitting layer 8B is only a difference in the materials contained in the first solution 28. That is, regardless of luminescent colors of the light-emitting layer 8 to be formed, the steps of the first application, the first heating, and the second heating may be implemented by the same method.

In the step of the first application, the material contained in the first solution 28 may be changed for each luminescent color of the corresponding light-emitting element, the first solution 28 may be subjected to separately patterning by an ink-jet method, and then the steps of the first heating and second heating described above may be performed. As a result, the light-emitting elements having mutually different luminescent colors can be formed by continuous single heating.

Next, the second charge transport layer 10 is formed (step S6). The second charge transport layer 10 may be applied and formed in common to all of the subpixels by a spin coat technique or the like.

Finally, the second electrode 12 is formed (step S7). The second electrode 12 may be film-formed in common to all of the subpixels by vapor deposition or the like. As described above, the light-emitting element layer 2 is formed on the array substrate 3, and the light-emitting device 1 illustrated in FIGS. 1A to 1C is obtained.

Note that, in the present embodiment, at least one set of the first quantum dots 20 may be connected to each other via the first shell 24. In the present embodiment, an area of the outer surface of the first shell 24 is smaller in the one set of the first quantum dots 20 than that in the case of not being connected. That is, in the present embodiment, an area of the outer surface of the first quantum dot 20 can be reduced compared to the case of simply layering quantum dots.

By reducing the area of the outer surface of the first quantum dot 20, the area of the surface of the first shell 24, through which moisture may infiltrate from the outside, can be reduced. Accordingly, this configuration may reduce damage to the first shell 24 due to the moisture infiltration, and may consequently suppress degradation in a surface protection function of the first quantum dot 20 by the first shell 24 due to the damage described above.

When the ligand 18 coordinates on the outer surface of the first quantum dot 20, the reduction of the area of the outer surface makes it possible to reduce the ligand 18 possible to be damaged by the moisture infiltration. Accordingly, the damage to the first shell 24 can be reduced due to the loss of the protection function by the ligand 18 for the first shell 24 due to the damage described above.

Furthermore, by reducing the area of the outer surface of the first quantum dot 20, the surface area of the first shell 24 possible to be damaged when the light-emitting device 1 is driven can be reduced. Thus, the above-discussed configuration may reduce damage to the first shell 24 accompanying the drive of the light-emitting device 1, and may consequently reduce the formation of defects in the first shell 24 due to the damage. As a result, by reducing the area of the outer surface of the first quantum dot 20, the occurrence of a non-emitting process caused by recombination of electrons and holes in the defects is suppressed, and consequently a decrease in luminous efficiency of the light-emitting device 1 is suppressed.

As described above, because of the outer surface of the first quantum dot 20 being small, the area of the outer surface of the first quantum dot 20 possible to be damaged can be reduced, and deactivation of the first quantum dot 20 can be reduced due to damage to the first quantum dot 20.

According to NPL 1, the average value of a random close packing ratio in the packing of rigid spheres is approximately 63.66 percent. Accordingly, in the present embodiment, the proportion of the volume of the first quantum dots 20 in the light-emitting layer 8 is preferably greater than or equal to 63.7 percent. With the above configuration, the density of the first quantum dots 20 in the light-emitting layer 8 can be enhanced compared to the case of randomly layering quantum dots each provided with a shell whose film thickness is equal to the film thickness of the first shell 24. Furthermore, with the configuration described above, the area of the outer surface of the first quantum dot 20 can more efficiently be decreased compared to the case of randomly layering quantum dots.

Conditions required to connect all of the first quantum dots 20 in the light-emitting layer 8 via the first shells 24 will now be described.

It is assumed that the first quantum dots 20 are arranged in an array of m rows and n columns on a plane. Positions where adjacent first quantum dots 20 can be connected, that is, the number of positions between lattice points arranged in the array of m rows and n columns is obtained by an equation of $m-(n-1)+n\times(m-1)=2mn-m-n$.

It is also assumed that, in a case where all of the first quantum dots 20 on the same plane are connected via the first shells 24, the number of sets of mutually connected first quantum dots 20 is assumed to be minimal. As one example of this case, an example is cited in which all the sets of adjacent quantum dots are connected in all the in-between positions of the rows, and any one set of adjacent quantum dots is connected to each other in each of all the in-between positions of the columns. In this case, the number of positions where the adjacent first quantum dots 20 are connected is obtained by an equation of $m-(n-1)+1-(m-1)=mn-1$.

Accordingly, in the case of the above-discussed conditions, the proportion of the positions where the first quantum dots 20 are actually connected to each other via the first shells 24 to the positions where all the first quantum dots 20 can be connected via the first shells 24 is expressed by a relation of $(mn-1)/(2mn-m-n)$.

The number of the first quantum dots 20 included in the light-emitting layer 8 of the actual light-emitting device 1 is significantly large; therefore, both m and n are sufficiently can be considered to be large. Thus, when m and n positively diverge, the above-mentioned proportion can be derived to be approximately 0.5.

Therefore, in the case where all of the first quantum dots 20 on the same plane are connected via the first shells 24, and among all of the sets of adjacent first quantum dots 20, the number of sets thereof being connected via the first shells 24 is minimal, these sets may be considered to be approximately 50 percent of all of the sets. Accordingly, in the case where, among all of the sets of adjacent first quantum dots 20, the sets thereof connected via the first shells 24 exceeds 50 percent, it can be said that there is a high probability that all the first quantum dots 20 in each of the layers being layered are connected via the first shells 24.

In the case where all the first quantum dots 20 are connected via the first shells 24, when the first quantum dot 20 is assumed to be one atom, it can be assumed that the first quantum dot 20 forms a crystal structure in which the first quantum dots 20 are connected to each other by the first shells 24. The above configuration may more efficiently decrease the area of the outer surface of the first quantum dot 20. Therefore, in the first quantum dot 20, it is preferable for the ratio of the adjacent first quantum dots 20 being connected to each other by the crystal structure of the first shells 24 to be greater than 50 percent and less than or equal to 100 percent.

In the present embodiment, the light-emitting layer 8 is formed after the formation of the array substrate 3, the first electrode 4, the edge covers 14, and the first charge transport layer 6. Therefore, it is preferable that the array substrate 3, the first electrode 4, the edge covers 14, and the first charge transport layer 6 contain a material having heat resistance with respect to heating in the above-mentioned heating steps.

The array substrate 3 may be, for example, a glass substrate containing alkali glass or the like having a sufficiently high strain point. Further, the array substrate 3 may be an organic substrate containing an organic material having a high glass-transition temperature, such as polyimide.

For example, when the light-emitting element layer 2 forms a bottom-emitting type light-emitting element and the first electrode 4 is an anode electrode, ITO is commonly used for the first electrode 4. However, in order to suppress an increase in specific resistance due to heating in the above-mentioned heating steps, the first electrode 4 preferably includes a material having high heat resistance such as a composite material of FTO and ITO. When the first charge transport layer 6 is a hole transport layer, it is preferable to contain an inorganic material having higher heat resistance than an organic material, such as NiO, MgNiO, $Cr_2O_3$, $Cu_2O$, or $LiNbO_3$.

In order to achieve a shape having a certain level of height and inclination, an organic material is generally used for the edge cover 14. In the present embodiment, from the perspective of reducing damage caused by heating in the above-mentioned heating steps, the edge cover 14 preferably contains an organic material having a high glass-transition temperature, such as polyimide.

The second charge transport layer 10 and the second electrode 12 are formed after the light-emitting layer 8 is formed. Accordingly, a material not having heat resistance against the heating in the above-mentioned heating steps can be employed for the material of the second charge transport layer 10 and the second electrode 12. For example, the second charge transport layer 10 may contain a material used for a known electron transport layer in the related art, and the second electrode 12 may contain a material used for a known cathode electrode in the related art.

Second Embodiment

Figure 7A:
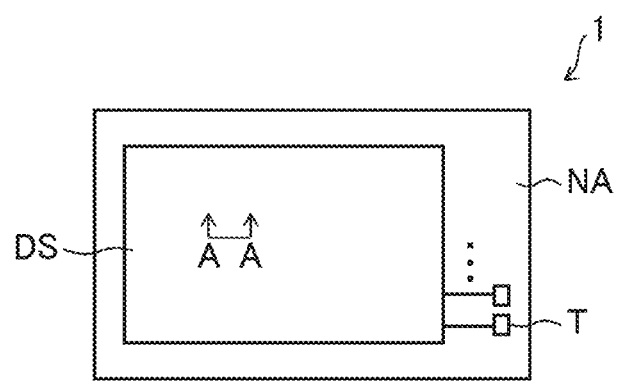
FIG. 7A is a schematic top view of a light-emitting device according to a second embodiment.
Figure 7B:
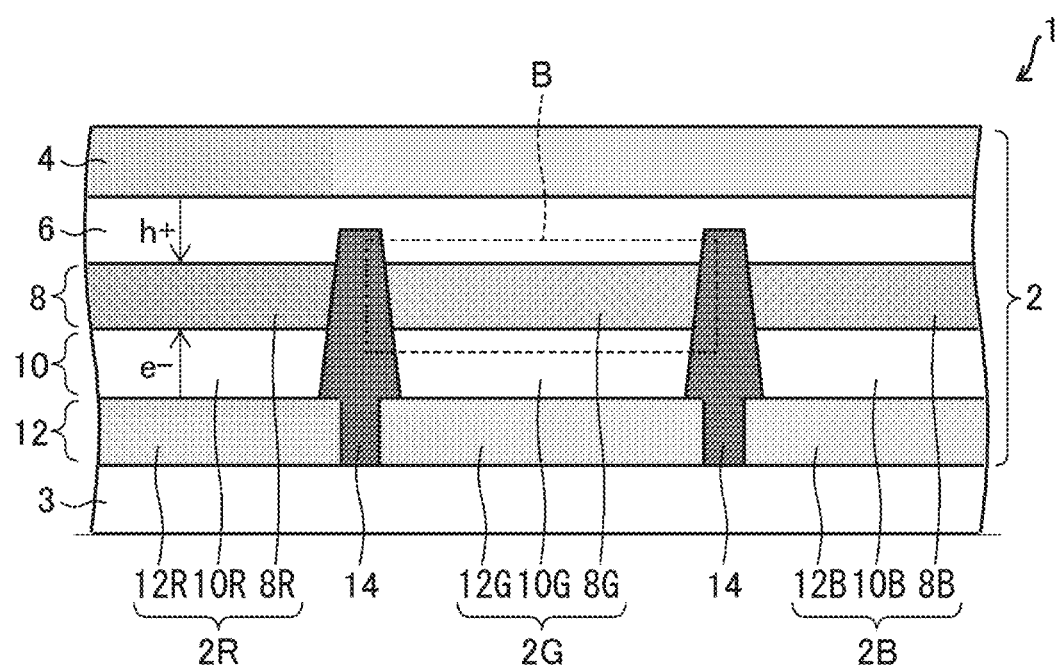
FIG. 7B is a cross-sectional view taken along a line A-A in FIG. 7A.
Figure 7C:
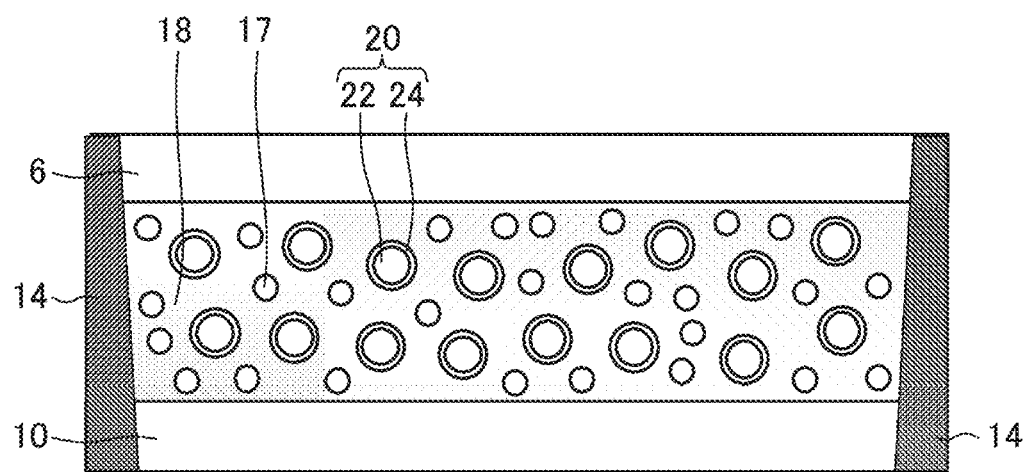
FIG. 7C is an enlarged cross-sectional view of a region B in FIG. 7B.

FIG. 7A is a schematic top view of a light-emitting device 1 according to the present embodiment. FIG. 7B is a cross-sectional view taken along a line A-A in FIG. 7A. FIG. 7C is an enlarged cross-sectional view of a region B in FIG. 7B.

The light-emitting device 1 according to the present embodiment may have the same configuration as that of the light-emitting device 1 according to the previous embodiment except that the layering order of each of the layers in a light-emitting element layer 2 is reversed. In other words, the light-emitting element layer 2 according to the present embodiment includes a second charge transport layer 10, a light-emitting layer 8, a first charge transport layer 6, and a first electrode 4, which are sequentially layered from the lower layer on a second electrode 12.

In the light-emitting device 1 according to the present embodiment, each of the second electrode 12 and the second charge transport layer 10 is separated by edge covers 14. In other words, in the present embodiment, the second electrode 12 is, by the edge covers 14, separated into a second electrode 12R for a first light-emitting element 2R, a second electrode 12G for a second light-emitting element 2G, and a second electrode 12B for a third light-emitting element 2B. Further, the second charge transport layer 10 is, by the edge covers 14, separated into a second charge transport layer 10R for the first light-emitting element 2R, a second charge transport layer 10G for the second light-emitting element 2G, and a second charge transport layer 10B for the third light-emitting element 2B.

Note that, in the present embodiment, the first charge transport layer 6 and the first electrode 4 are not separated by the edge covers 14, and are each formed in a shared manner.

In the present embodiment, the first electrode 4 may be a transparent electrode and the second electrode 12 may be a reflective electrode. Therefore, light from the light-emitting layer 8 passes through the first charge transport layer 6 and the first electrode 4, and is emitted from a light-emitting face DS to the outside of the light-emitting device 1. Due to this, the light-emitting device 1 is configured as a top-emitting type light-emitting device. Because of this, in the present embodiment, an array substrate 3 need not necessarily be a transparent substrate.

The light-emitting device 1 according to the present embodiment can be manufactured by performing each of the steps illustrated in FIG. 2 in the order of step S1, step S7, step S3, step S6, step S5, step S4, and step S2 in a similar manner to that of the previous embodiment. Thus, in the present embodiment, the light-emitting layer 8 is formed after the formation of the array substrate 3, the second electrode 12, the edge covers 14, and the second charge transport layer 10. Therefore, it is preferable that the array substrate 3, the second electrode 12, the edge covers 14, and the second charge transport layer 10 contain a material having heat resistance with respect to heating in the above-mentioned heating step.

For example, when the light-emitting element layer 2 forms a top-emitting type light-emitting element and the second electrode 12 is a cathode electrode, the second electrode 12 preferably contains a metal material with a high melting point from the perspective of enhancing heat resistance with respect to heating in the heating step described above. For example, it is preferable for the second electrode 12 to contain a metal such as Al or Ag, or an intermetallic compound such as AgMg. When the second charge transport layer 10 is an electron transport layer, it is preferable to contain an inorganic material having higher heat resistance than an organic material, such as MgO. The materials described above are also materials used as a cathode electrode material and an electron transport layer material in general.

The first charge transport layer 6 and the first electrode 4 are formed after the light-emitting layer 8 is formed. Accordingly, a material not having heat resistance against the heating in the above-mentioned heating step can be employed for the material of the first charge transport layer 6 and the first electrode 4. For example, the first charge transport layer 6 may contain a material used for a known hole transport layer in the related art, and the first electrode 4 may contain a transparent conductive material used for a known anode electrode in the related art, such as ITO.

The light-emitting device 1 according to the present embodiment has a low level of necessity to change the materials of each layer in the light-emitting element layer 2 in comparison with the light-emitting device 1 according to the previous embodiment.

Accordingly, the light-emitting device 1 according to the present embodiment can improve the degree of freedom in material selection in comparison with the light-emitting device 1 according to the previous embodiment.

Third Embodiment

Figure 8A:
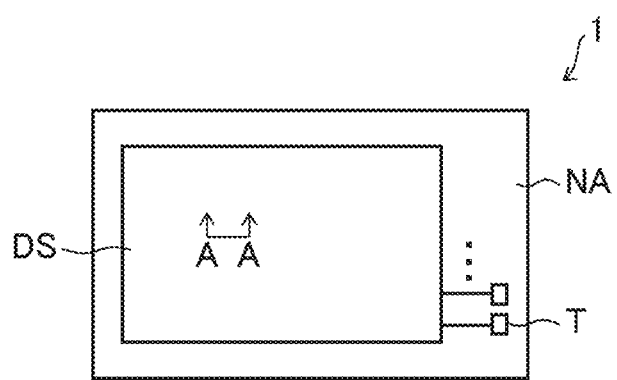
FIG. 8A is a schematic top view of a light-emitting device according to a third embodiment.
Figure 8B:
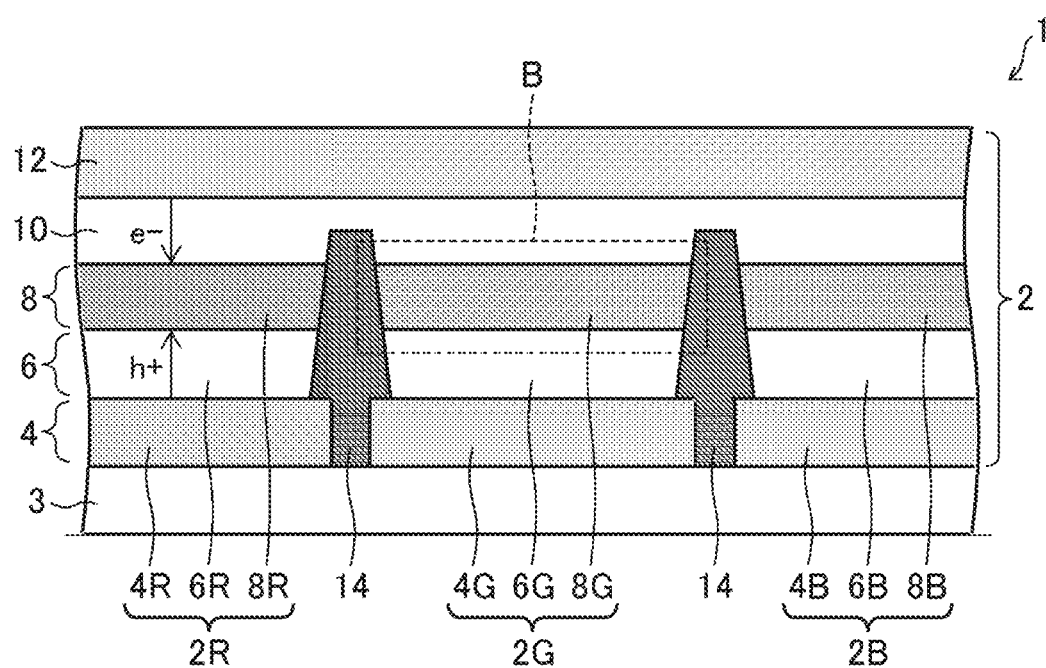
FIG. 8B is a cross-sectional view taken along a line A-A in FIG. 8A.
Figure 8C:
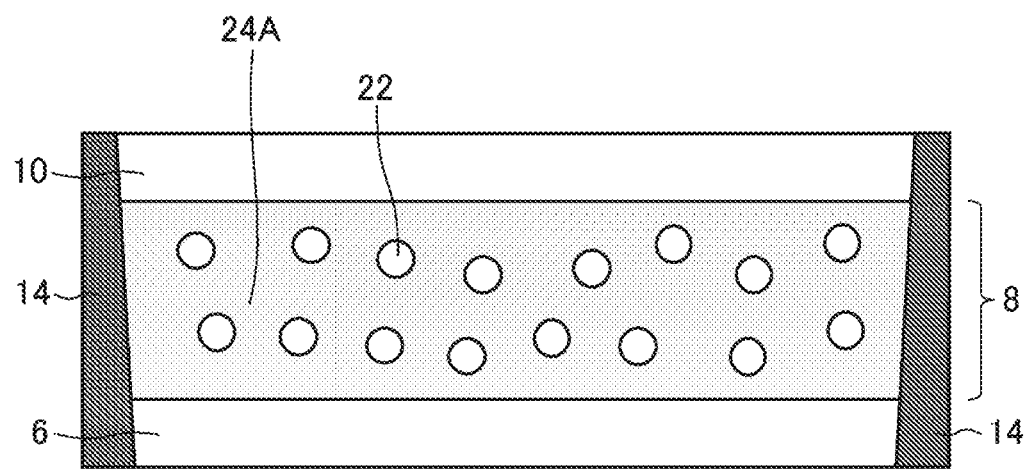
FIG. 8C is an enlarged cross-sectional view of a region B in FIG. 8B.

FIG. 8A is a schematic top view of a light-emitting device 1 according to the present embodiment. FIG. 8B is a cross-sectional view taken along a line A-A in FIG. 8A. FIG. 8C is an enlarged cross-sectional view of a region B in FIG. 8B.

The light-emitting device 1 according to the present embodiment may be different from the light-emitting device 1 of the previous embodiments in a point that a light-emitting layer 8 is inorganic, and have the same configuration as that of the light-emitting device 1 of the previous embodiments except for the different point.

In the present embodiment, the light-emitting layer 8 includes a core 22 and a shell layer 24A. The shell layer 24A is a layer formed of the same material as the first shell 24 (see FIG. 1C), and fills a void in the core 22. Further, the shell layer 24A coordinates with the core 22 on an outer surface of the core 22. In the present embodiment, a quantum dot included in the light-emitting layer 8 is a quantum dot (quantum dot of a core type) that does not include a shell epitaxially growing around the core 22 and is substantially formed of only the core 22.

In the present embodiment, the shell layer 24A is interposed between adjacent cores 22. That is, adjacent cores 22 are separated from each other. However, among the plurality of cores 22, at least one set of cores 22 adjacent to each other may be connected to each other.

The light-emitting device 1 according to the present embodiment is manufactured by the same method except for step S5, that is, the step of forming the light-emitting layer among the steps illustrated in FIG. 2. The step of forming the light-emitting layer of the light-emitting device 1 according to the present embodiment will be described in more detail with reference to FIGS. 9 to 13.

Figure 9:
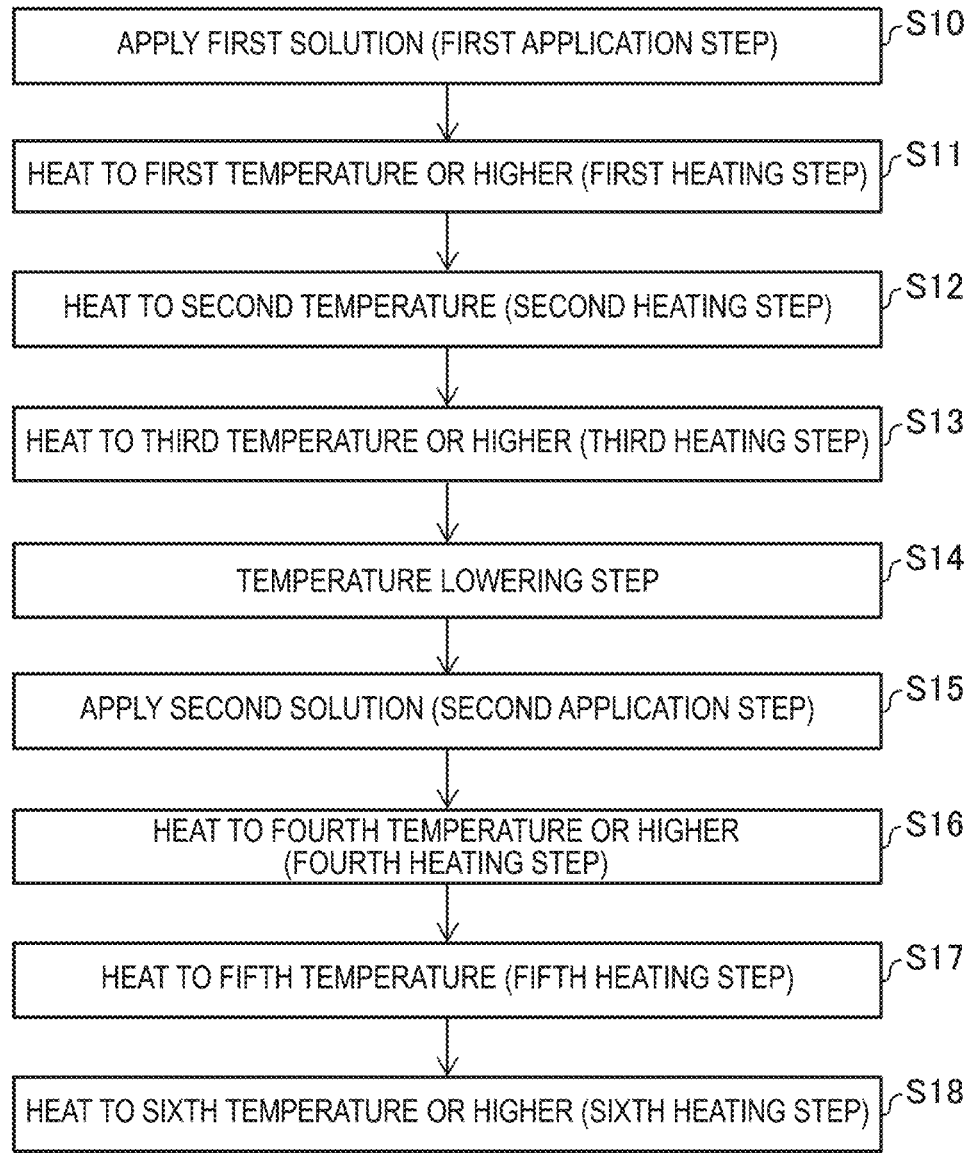
FIG. 9 is a flowchart for describing a method for manufacturing the light-emitting device according to the third embodiment.
Figure 10:
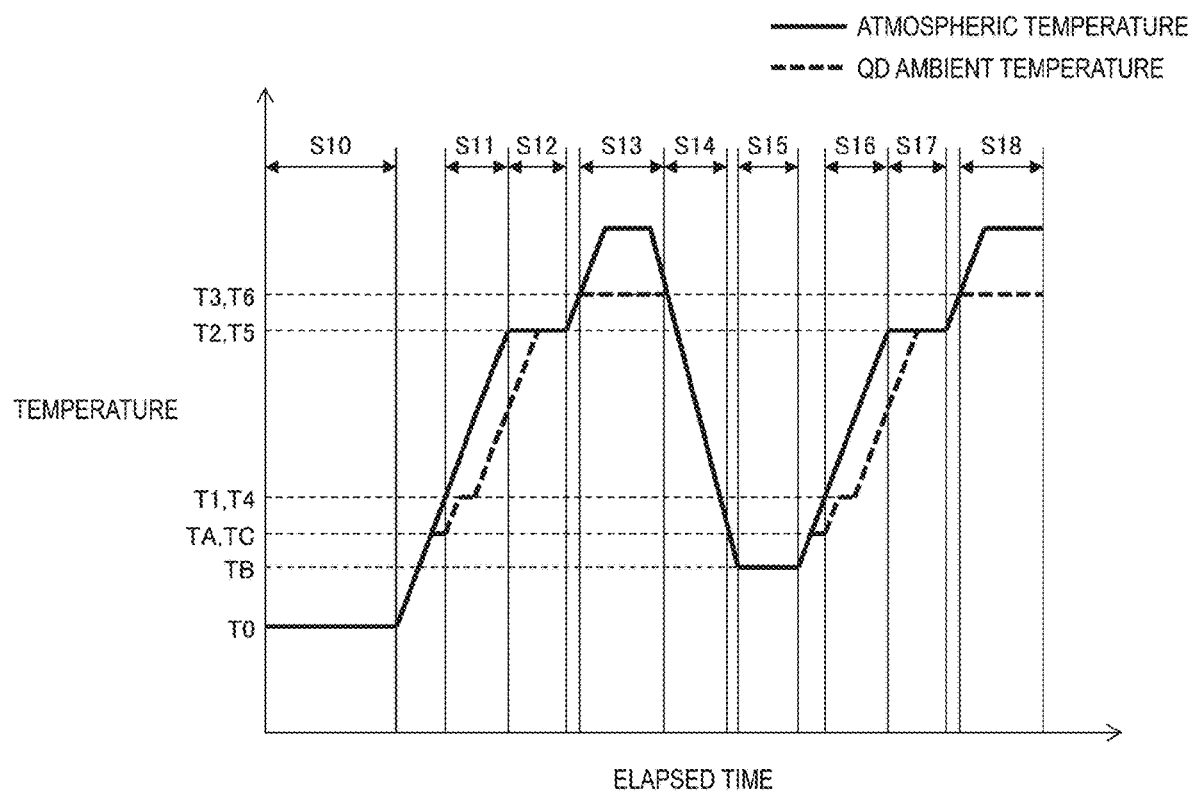
FIG. 10 is a graph for describing a relationship between an elapsed time and a temperature in a step of forming a light-emitting layer according to the third embodiment.

FIG. 9 is a flowchart for describing the step of forming the light-emitting layer corresponding to a step of forming a quantum dot layer in the present embodiment. FIG. 10 is a graph for describing a relationship between an elapsed time and a temperature in the step of forming the light-emitting layer. Similar to FIG. 4, a solid line in FIG. 10 indicates an atmospheric temperature around an array substrate 3, and a broken line indicates a temperature around the core 22 on the array substrate 3. FIGS. 11A to 13 are forming-step cross-sectional views for describing the step of forming the light-emitting layer.

Figure 11A:
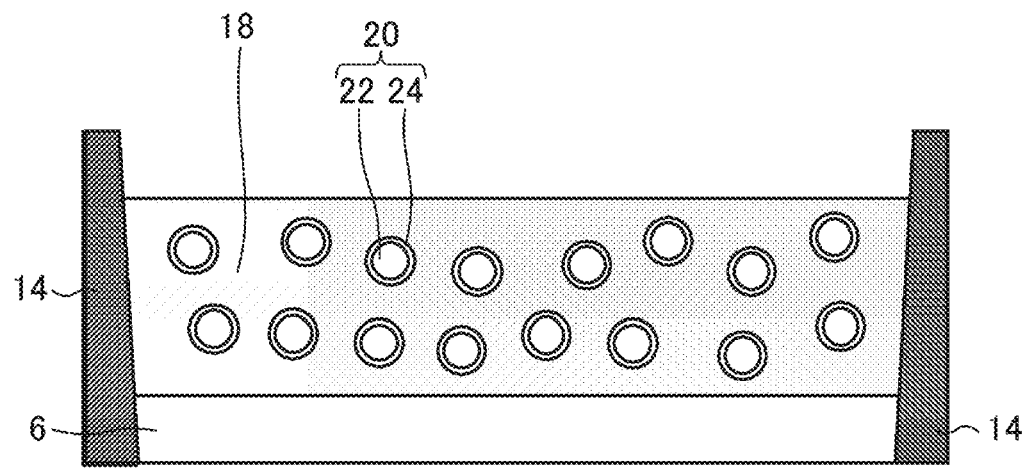
FIG. 11A is a cross-sectional view of a substrate completed up to step S12 according to the third embodiment.

In the step of forming the light-emitting layer according to the present embodiment, the same method as that described in the previous embodiment is performed from step S10 to step S12. At the point in time of the completion of step S12, a first quantum dot 20 and a ligand 18 are formed in an upper layer relative to a first charge transport layer 6, as illustrated in FIG. 11A. Note that a second quantum dot 17 may be further formed in the ligand 18.

In the present embodiment, subsequent to step S12, a step of third heating is performed in which the atmosphere is heated so that the atmospheric temperature rises to reach a third temperature T3 or higher (step S13). The third temperature T3 is higher than the second temperature T2, and is equivalent to a boiling point of the ligand 18. For example, in the case where the ligand 18 is the aforementioned TOPO, the third temperature T3 is 411.2 degrees Celsius. Note that, by performing the step of the temperature lowering in step S13A (FIG. 3) after step S12 and before step S13, the ligand 18 may be cured in a layered manner. In this way, unlike the liquid ligand 18, contamination of foreign matters into the layered ligand 18 can be suppressed.

Figure 11B:
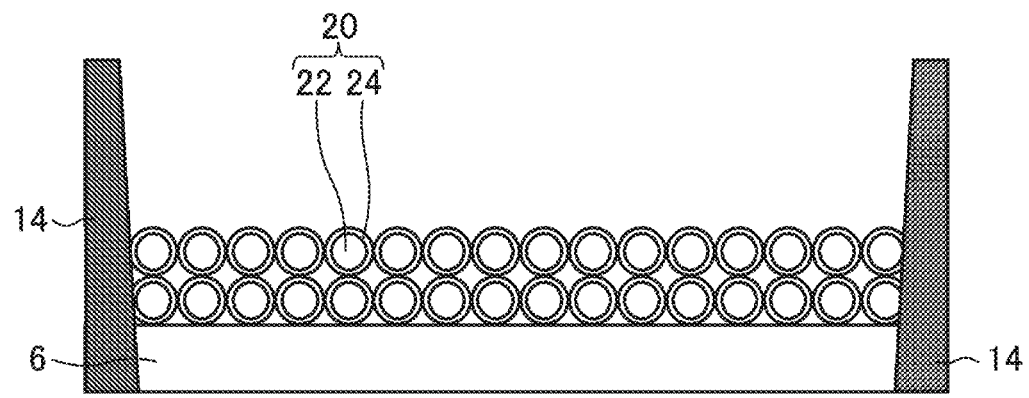
FIG. 11B is a cross-sectional view of a substrate in which a ligand is vaporized from the substrate illustrated in FIG. 11A.

When the ambient temperature of the first quantum dots 20 reaches the third temperature T3 by heating the atmosphere in the step of the third heating, vaporization of the ligand 18 begins and the ambient temperature of the first quantum dots 20 maintains the third temperature T3 for a while. Thus, in the step of the third heating, the ligand 18 vaporizes as illustrated in FIG. 11B.

Subsequent to step S13, a step of temperature lowering in which an atmospheric temperature is reduced to a temperature lower than the third temperature T3 is performed (step S14).

In the present embodiment, with the step of the temperature lowering, cooling is performed until the atmospheric temperature becomes a temperature TB, which is lower than the temperature TA. The temperature TB may be higher than the temperature T0 or may be equal to the temperature T0. When the atmospheric temperature drops, the temperature around the first quantum dots 20 also drops following the atmospheric temperature. At the point in time of the completion of the step of the temperature lowering, the plurality of first quantum dots 20 are formed in the layered manner in an upper layer relative to the first charge transport layer 6, as illustrated in FIG. 11B.

Figure 11C:
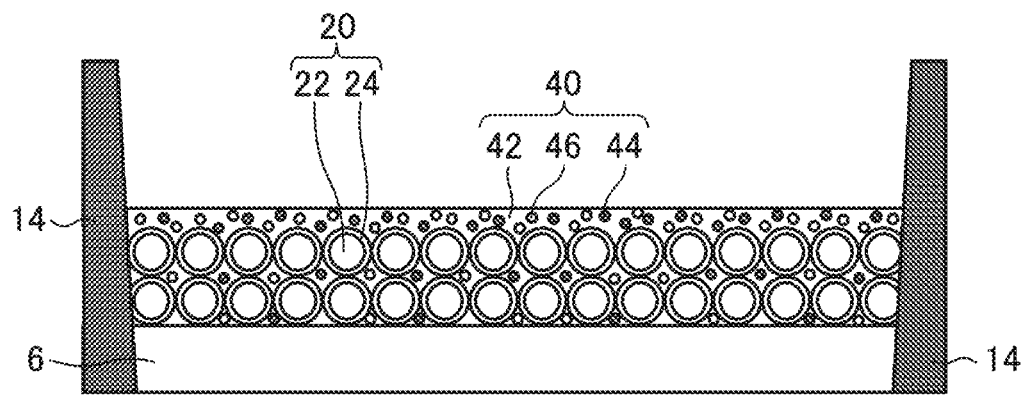
FIG. 11C is a cross-sectional view of a substrate in which a second solution is applied to the substrate illustrated in FIG. 11B.

After the atmospheric temperature has reached the temperature TB by the step of the temperature lowering, a step of second application is performed in which a second solution 40 is applied on a position overlapping with the array substrate 3 as illustrated in FIG. 11C (step S15). By the step of the second application, at least part of the void in the periphery of the first quantum dots 20 may be filled with the second solution 40, as illustrated in FIG. 11C.

The second solution 40 contains a second solvent 42, an organic material (second ligand) 44, and a second inorganic precursor 46. The second solvent 42 may be the same as the first solvent 32, and may be hexane. The organic material 44 may be an organic material used for a ligand of conventionally known quantum dots, or may be the same material as that of the ligand 18. The second inorganic precursor 46 contains the same material as the first shell 24. That is, the second inorganic precursor 46 is made of the same material as the first inorganic precursor 30.

Subsequently, the heating of the array substrate 3, on which the second solution 40 is applied, is restarted. Here, a step of fourth heating is performed by heating the atmosphere to a temperature equal to or higher than a fourth temperature T4 indicated in FIG. 10 (step S16).

The fourth temperature T4 is the higher temperature of a melting point of the organic material 44 and a boiling point of the second solvent 42. A temperature TC indicated in FIG. 4 is the lower temperature of the melting point of the organic material 44 and the boiling point of the second solvent 42. The fourth temperature T4 and the temperature TC are higher than the temperature T0. The fourth temperature T4 may be equal to the first temperature T1, and the temperature TC may be equal to the temperature TA.

The ambient temperature of the first quantum dots 20 follows a rise of the atmospheric temperature, as illustrated in FIG. 10, until the atmospheric temperature rises from the temperature T0 to the temperature TC. However, when the ambient temperature of the first quantum dots 20 rises up to the temperature TC and one of the melting of the organic material 44 and the evaporation of the second solvent 42 begins, the ambient temperature of the first quantum dots 20 maintains the temperature TC for a while.

By further carrying on the heating of the atmosphere, one of the melting of the organic material 44 and the evaporation of the second solvent 42 ends, and the ambient temperature of the first quantum dots 20 begins to rise again. Then, when the ambient temperature of the first quantum dots 20 rises up to the fourth temperature T4 and the other one of the melting of the organic material 44 and the evaporation of the second solvent 42 begins, the ambient temperature of the first quantum dots 20 maintains the fourth temperature T4 for a while.

Figure 12A:
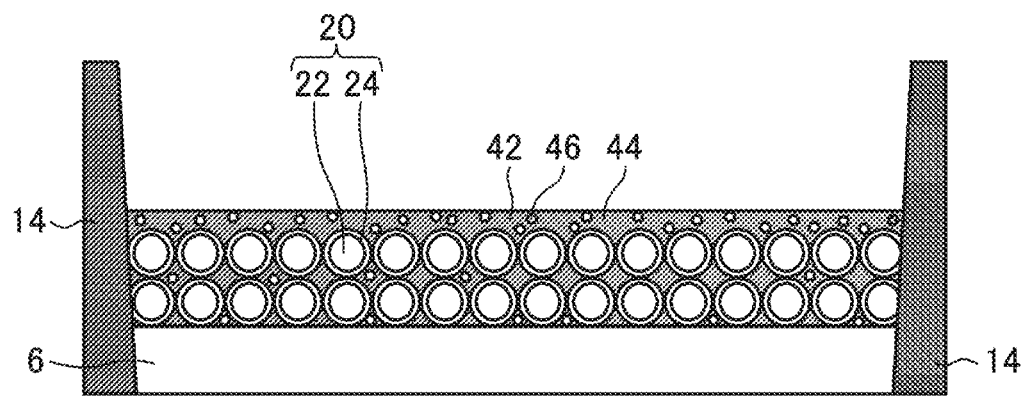
FIG. 12A is a cross-sectional view of a substrate in which a second solvent is vaporized from the second solution illustrated in FIG. 11C.

Thus, by the step of the fourth heating, the melting of the organic material 44 and the evaporation of the second solvent 42 are completed. After the completion of the step of the fourth heating, as illustrated in FIG. 12A, the second solvent 42 has vaporized from above the array substrate 3, and the second inorganic precursor 46 is dispersed in the periphery of the first quantum dots 20 in the melted organic material 44. The second inorganic precursor 46 is also dispersed in a gap between the first quantum dots 20.

Subsequently, the heating of the array substrate 3 is continued until the atmospheric temperature reaches a fifth temperature T5 indicated in FIG. 10. From the point in time when the atmospheric temperature reaches the fifth temperature T5, a step of fifth heating is performed in which heating conditions are adjusted to maintain the atmospheric temperature at approximately the fifth temperature T5 (step S17).

After the completion of the melting of the organic material 44 and the evaporation of the second solvent 42, the ambient temperature of the first quantum dots 20 rises from the fourth temperature T4 and reaches the fifth temperature T5. Since the atmospheric temperature is maintained at the fifth temperature T5, the ambient temperature of the first quantum dots 20 having reached the fifth temperature T5 is also maintained at the fifth temperature T5.

Figure 12B:
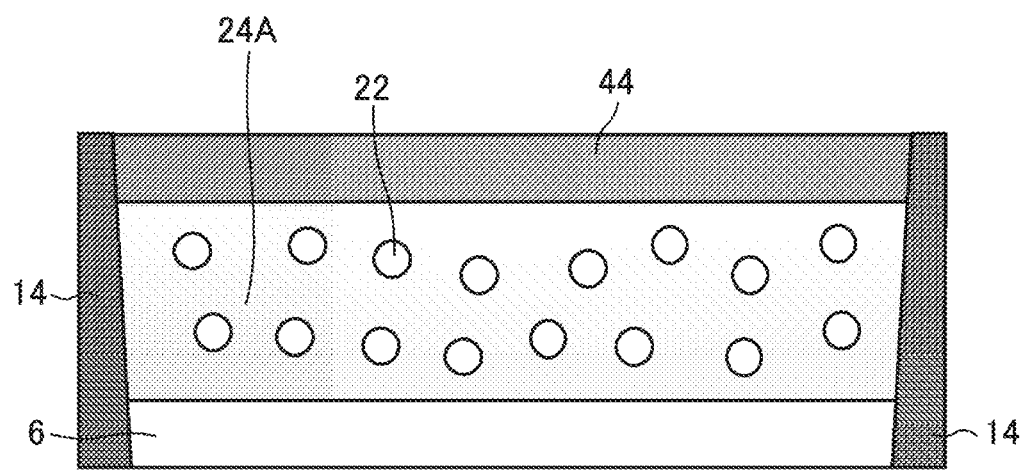
FIG. 12B is a cross-sectional view of a substrate in which a first quantum dot is formed according to a fourth embodiment.

The fifth temperature T5 is higher than the fourth temperature T4, and is a temperature at which the second inorganic precursor 46 epitaxially grows around the first shell 24 by thermochemical reaction. Thus, while the ambient temperature of the first quantum dots 20 is maintained at the fifth temperature T5, the second inorganic precursor 46 gradually grows epitaxially around the first shell 24. With this, as illustrated in FIG. 12B, a gap between the first shells 24 of adjacent first quantum dots 20 is filled to form the shell layer 24A in which each of the first shells 24 is connected in the layered manner.

As described above, as illustrated in FIG. 12B, the layer including the core 22 and the shell layer 24A is formed. Note that, in the step of the fifth heating, by forming the shell layer 24A, the melted organic material 44 is pushed up to an upper layer of the shell layer 24A, whereby the organic material 44 remains in the upper layer relative to the shell layer 24A.

Subsequently, a step of sixth heating is performed in which the atmosphere is heated so that the atmospheric temperature further rises to reach a sixth temperature T6 or higher (step S18). The sixth temperature T6 is higher than the fifth temperature T5, and is equivalent to the boiling point of the organic material 44.

Figure 13:
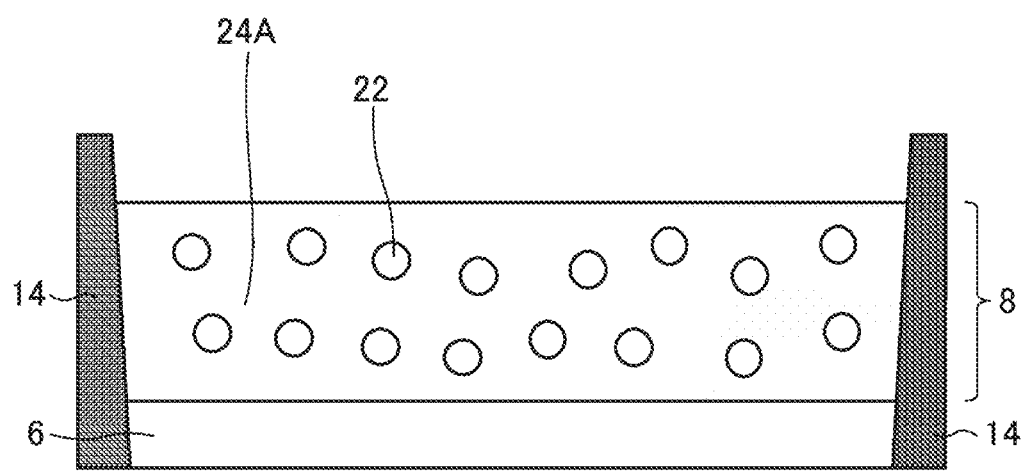
FIG. 13 is a cross-sectional view of a substrate in which a step of forming a light-emitting layer is completed according to the fourth embodiment.

When the ambient temperature of the first quantum dots 20 reaches the sixth temperature T6 by heating the atmosphere in the step of the sixth heating, evaporation of the organic material 44 begins and the ambient temperature of the first quantum dots 20 maintains the sixth temperature T6 for a while. With this, in the step of the sixth heating, the organic material 44 vaporizes, and as illustrated in FIG. 13, the organic material 44 is removed. As described above, the step of forming the light-emitting layer in the present embodiment is completed.

In the light-emitting device 1 according to the present embodiment, the shell layer 24A is formed in the layered manner around the core 22. In other words, the voids between adjacent cores 22 are filled with the shell layer 24A. In this way, in the present embodiment, the light-emitting layer 8 is inorganic.

Fourth Embodiment

In each of the heating steps described in the first and second embodiments, the core 22 of the array substrate 3 may be directly heated by irradiating the core 22 with light instead of heating the core 22 by heating the atmosphere around the array substrate 3.

A light-emitting device 1 according to the present embodiment is manufactured by the same method except for step S5, that is, the step of forming the light-emitting layer among the steps illustrated in FIG. 2. A step of forming a light-emitting layer of the light-emitting device 1 according to the present embodiment will be described with reference to FIGS. 5A to 6B, FIG. 14, and FIG. 15.

Figure 14:
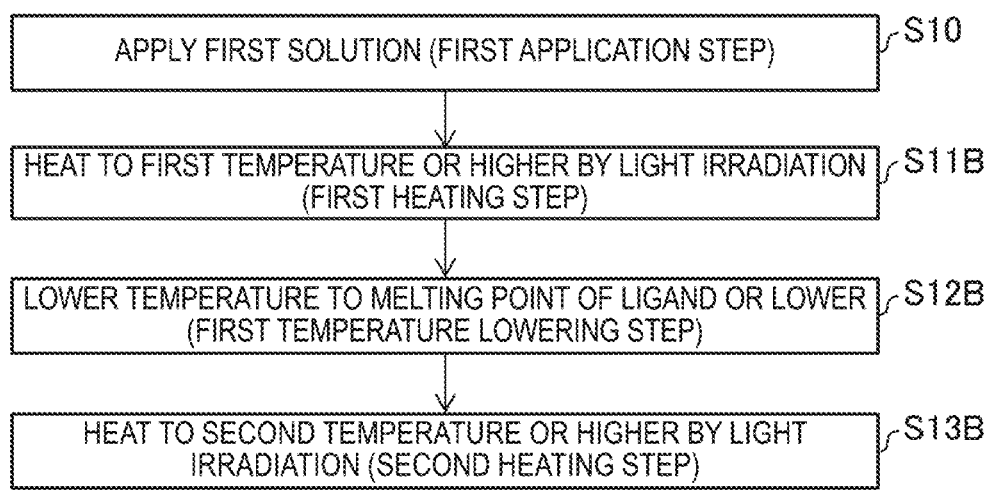
FIG. 14 is a flowchart for describing a step of forming a light-emitting layer according to a fifth embodiment.

FIG. 14 is a flowchart for describing the step of forming the light-emitting layer corresponding to a step of forming a quantum dot layer in the present embodiment.

Figure 15:
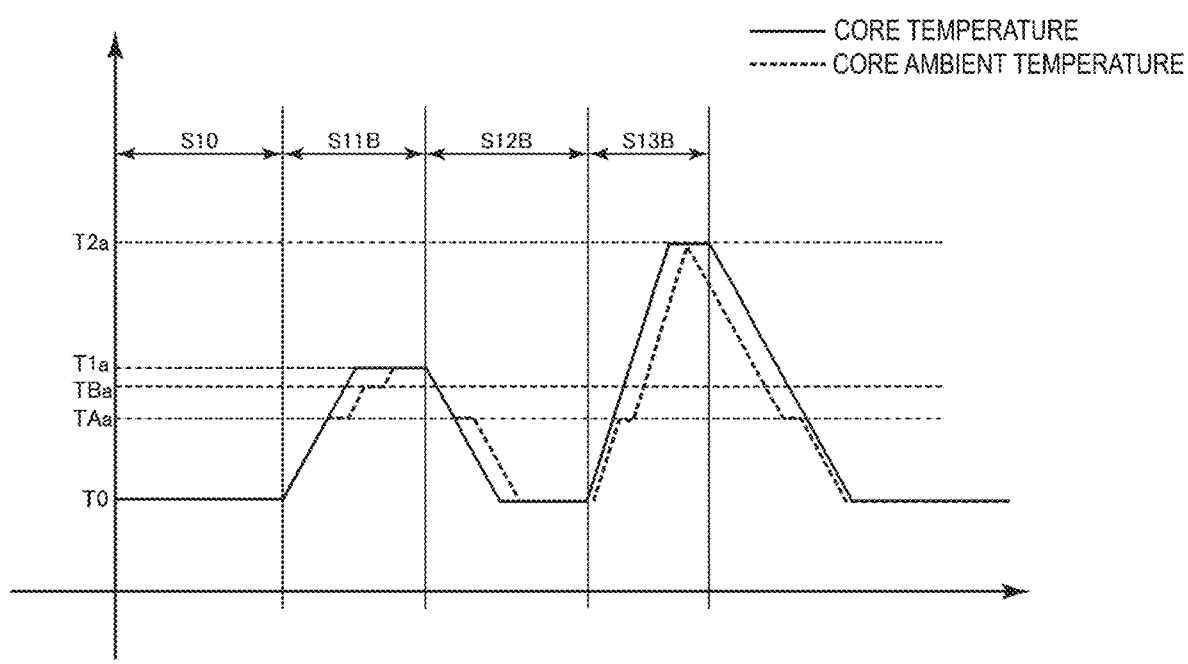
FIG. 15 is a graph for describing a relationship between an elapsed time and a temperature in the step of forming the light-emitting layer according to the fifth embodiment.

FIG. 15 is a graph for describing a relationship between an elapsed time and a temperature in the step of forming the light-emitting layer. In FIG. 15, the horizontal axis represents the elapsed time of the step of forming the light-emitting layer, and the vertical axis represents the temperature. A solid line in FIG. 15 indicates a temperature of a core 22 on an array substrate 3, a broken line indicates a temperature around the core 22, and a dotted line indicates a temperature of a ligand 18 except for the ligand 18 disposed around the core 22.

As illustrated in FIG. 5A, the formation up to a first charge transport layer 6 has been performed on the array substrate 3 until the step of forming the light-emitting layer. In the step of forming the light-emitting layer, first, a step of first application is performed in which a first solution 28 illustrated in FIG. 5B is applied on a position overlapping with the array substrate 3 (step S10). The step of the first application is performed at an atmospheric temperature of a temperature T0, as illustrated in FIG. 15.

Subsequently, a step of first heating is performed in which light irradiation is performed in such a manner that the first solution 28 on the array substrate 3 is irradiated with light such as ultraviolet light so as to heat particles 16 (step S11B). In the step of the first heating in step S11B, the particles 16 are heated until the particles 16 have a first temperature $T1a$ or higher as indicated in FIG. 15.

The first temperature $T1a$ indicated in FIG. 15 is a temperature higher than a melting point of the ligand 18 and a boiling point of a first solvent 32. A temperature TAa indicated in FIG. 15 is the melting point of the ligand 18, and a temperature TBa is the boiling point of the first solvent 32.

The first temperature T1a and the temperature TAa are higher than the temperature T0. Note that the temperature TAa may be the boiling point of the first solvent 32, and the temperature TBa may be the melting point of the ligand 18.

In a case where the ligand 18 is TOPO and the first solvent is hexane, the temperature TAa is the melting point of the TOPO, and the first temperature T1a is the boiling point of the hexane.

The ambient temperature of the particles 16 follows a rise of the temperature of the particles 16 with a slight delay, as illustrated in FIG. 15, until the temperature of the particles 16 rises from the temperature T0 to the temperature TAa. However, when the ambient temperature of the particles 16 rises up to the temperature TAa and one of the melting point of the ligand 18 and the evaporation of the first solvent 32 begins, the ambient temperature of the particles 16 maintains the temperature TAa for a while.

By further carrying on the step of the first heating, the melting of the ligand 18 ends, and the ambient temperature of the particles 16 begins to rise again. Then, when the ambient temperature of the particles 16 rises up to the temperature TBa and the other one of the melting of the ligand 18 and the evaporation of the first solvent 32 begins, the ambient temperature of the particles 16 maintains the first temperature T1a for a while.

Thus, the melting of the ligand 18 and the evaporation of the first solvent 32 are completed by the step of the first heating. When the first temperature T1a is the boiling point of the first solvent 32, in the step of the first heating, the first solvent 32 vaporizes after the ligand 18 has melted. On the other hand, when the first temperature T1a is the melting point of the ligand 18, in the step of the first heating, the ligand 18 melts after the first solvent 32 has vaporized.

After the completion of the step of the first heating, as illustrated in FIG. 6A, the first solvent 32 has vaporized from above the array substrate 3, and the cores 22 and a first inorganic precursor 30 are dispersed in the melted ligand 18.

Next, a step of first temperature lowering is performed in which the temperature of the array substrate 3 is lowered to the melting point of the ligand 18 or lower (step S12B). The step of the first temperature lowering may be performed by storing the array substrate 3 in a cooling environment, or the array substrate 3 may be naturally cooled by stopping the step of the first heating.

By carrying on the step of the first temperature lowering, first, the temperature of the cores 22 is lowered from the first temperature T1a to the temperature TAa. When the temperature of the cores 22 reaches the temperature TAa, solidification of the melted ligand 18 begins. Then, the ambient temperature of the cores 22 maintains the temperature TAa until the solidification of the ligand 18 is completed. By further carrying on the step of the first temperature lowering, the solidification of the ligand 18 is completed, and then the ambient temperature of the cores 22 follows a decrease of the temperature of the cores 22 with a slight delay, and reaches the temperature T0.

Subsequently, a step of second heating is performed in which second light irradiation is performed on the position where the first solution 28 has been applied on the array substrate 3 so as to heat the cores 22 (step S13B). In the step of the second heating, the second light irradiation is continued until the temperature of the cores 22 reaches a second temperature T2a indicated in FIG. 15. In the second light irradiation, ultraviolet light may be emitted as in light irradiation in the step of the first heating, or light having a larger amount of energy per unit time than the light emitted in the step of the first heating may be emitted.

By carrying on the step of the second heating, first, the temperature of the cores 22 reaches the temperature TAa. When the temperature TAa is reached, the ligand 18 around the cores 22 of the solidified ligand 18 is melted again. Then, the ambient temperature of the cores 22 maintains the temperature TAa until the melting of the ligand 18 around the cores 22 is completed, and follows the temperature of the cores 22 with a slight delay. Here, the first solvent 32 has already been evaporated. Thus, the ambient temperature of the cores 22 is not affected by the temperature TBa.

Subsequently, in the step of the second heating, the temperature of the cores 22 maintains a temperature at approximately the second temperature T2a from the point in time when the temperature of the cores 22 reaches the second temperature T2a. Herein, ultraviolet light may be emitted as in the light irradiation in the step of the first heating and the second light irradiation, or light having a smaller amount of energy per unit time than the light emitted in the second light irradiation may be emitted. Since the temperature of the cores 22 is maintained at the second temperature T2a, the ambient temperature of the cores 22 having reached the second temperature T2a is also maintained at the second temperature T2a.

In each of the steps of heating in the present embodiment, when an amount of heat generated in the cores 22 and an amount of heat dissipated toward the peripheral environment of the array substrate 3 are balanced, the temperature around the cores 22 is substantially constant at a certain temperature.

The second temperature T2a is higher than the first temperature T1a, and is a temperature at which the first inorganic precursor 30 epitaxially grows around the cores 22 by thermochemical reaction. Thus, while the ambient temperature of the cores 22 is maintained at the second temperature T2a, the first inorganic precursor 30 gradually grows epitaxially around the cores 22. With this, a first shell 24 is formed around each of the cores 22, as illustrated in FIG. 6B. Further, the first inorganic precursor 30 remaining in the ligand 18 becomes a second quantum dot 17 made of the same material as the first shell 24 in the ligand 18. When the first inorganic precursor 30 contains zinc chloride and 1-Dodecanethiol as discussed above, the second temperature T2a is approximately 200 degrees Celsius.

As described above, as illustrated in FIG. 6B, a first quantum dot 20 including the core 22 and the first shell 24 is formed. After this, the light irradiation with respect to the array substrate 3 is stopped and cooling is carried out, whereby the melted ligand 18 is solidified again. In this way, a light-emitting layer 8 illustrated in FIG. 6B including the first quantum dot 20, the second quantum dot 17, and the ligand 18 is obtained.

Note that, instead of performing heating by light irradiation in any one of the step of the first heating (step S11B illustrated in FIG. 14) and the step of the second heating (step S13B illustrated in FIG. 14), the array substrate 3 may be heated by heating the atmosphere around the array substrate 3 by setting the array substrate 3 in a furnace or the like.

In the step of forming the light-emitting layer, after the first solution 28 is applied at a position overlapping with a first electrode 4 in the step of the first application, partial exposure by laser irradiation may be performed in each of the step of the first heating by light irradiation and the step of the second heating by light irradiation. Thereafter, a step of removal may be performed in which the first solution 28 is removed from a position overlapping with a position different from the position where the partial exposure was performed. As a result, the light-emitting layer 8 may be formed only at the position partially exposed by the laser irradiation.

In the step of forming the light-emitting layer, after the first solution 28 is applied at a position overlapping with the first electrode 4 in the step of the first application, partial exposure using a photomask may be performed in each of the step of the first heating by light irradiation and the step of the second heating by light irradiation.

Fifth Embodiment

In each of the heating steps described in the third embodiment, the core 22 of the array substrate 3 may be directly heated by irradiating the core 22 with light instead of heating the core 22 by heating the atmosphere around the array substrate 3. A light-emitting device 1 according to the present embodiment is manufactured by the same method except for step S5, that is, the step of forming the light-emitting layer among the steps illustrated in FIG. 2. A step of forming a light-emitting layer of the light-emitting device 1 according to the present embodiment will be described with reference to FIGS. 11A to 13, FIG. 16, and FIG. 17.

Figure 16:
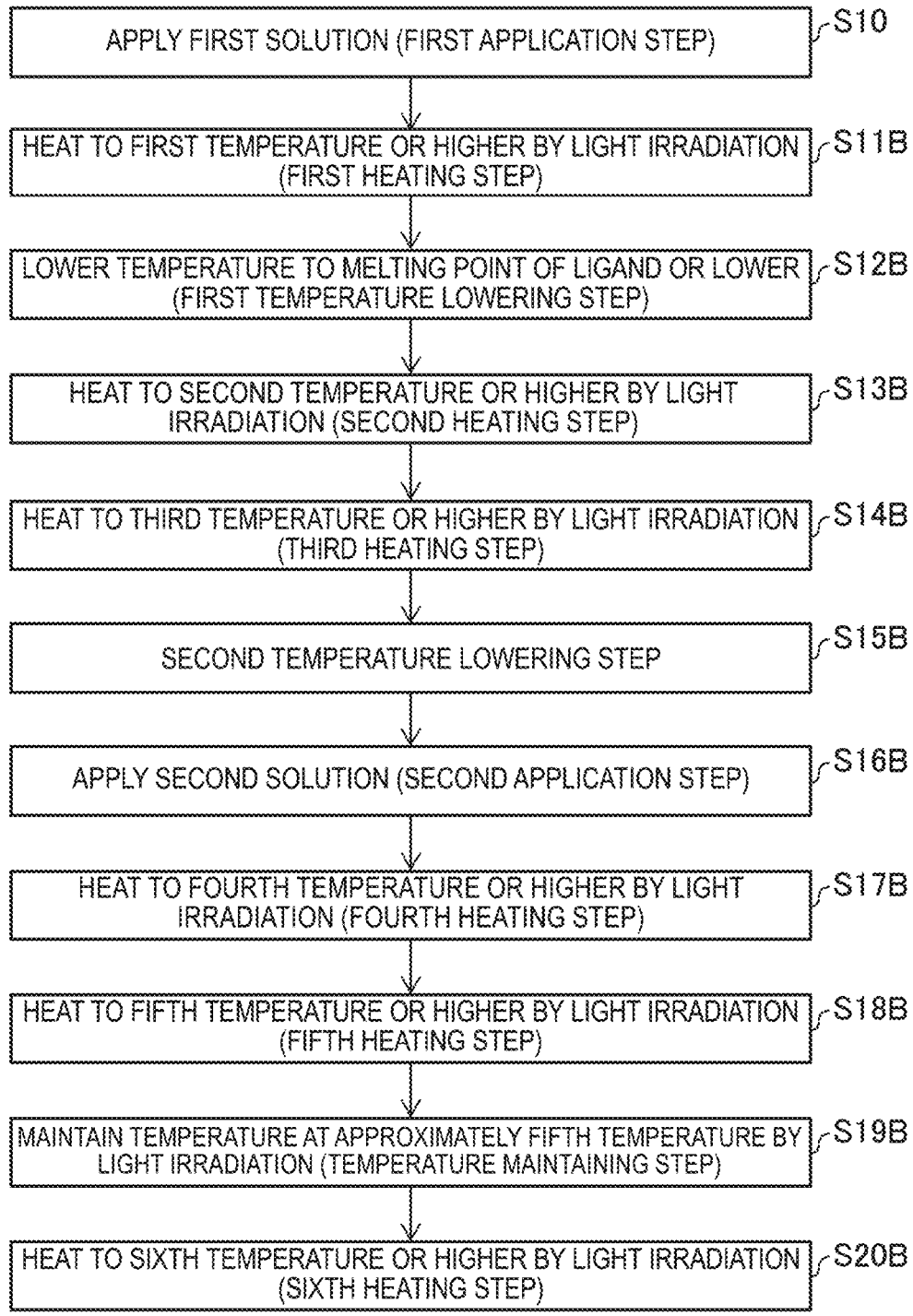
FIG. 16 is a flowchart for describing a method for manufacturing a light-emitting device according to the fifth embodiment.
Figure 17:
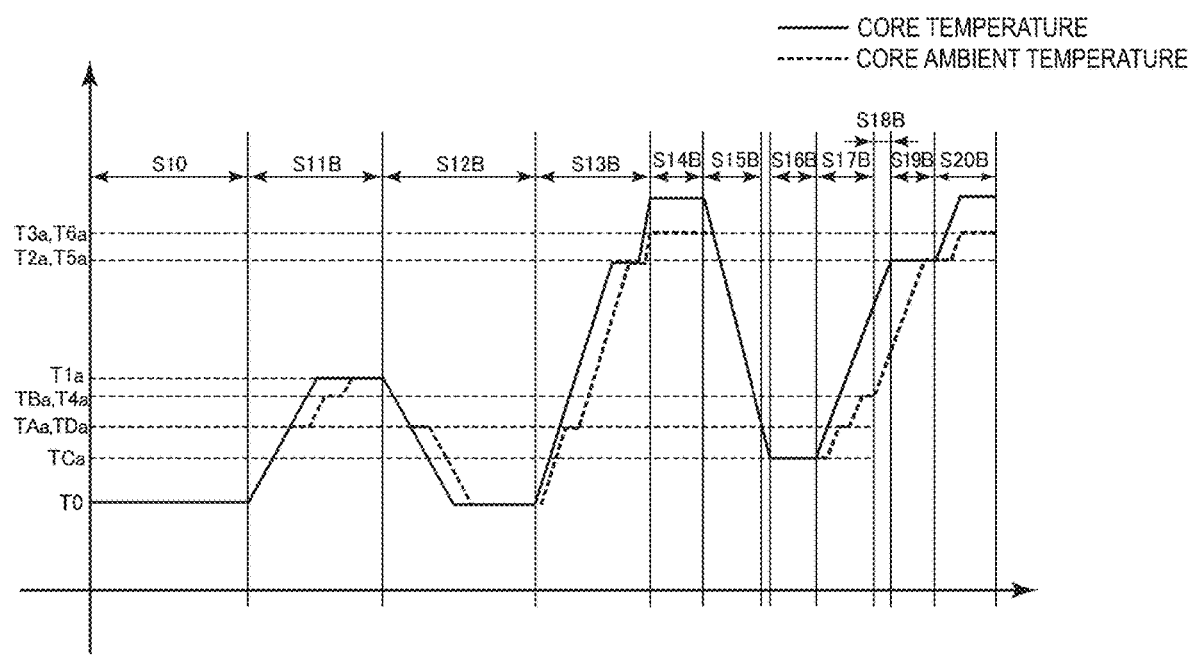
FIG. 17 is a graph for describing a relationship between an elapsed time and a temperature in the step of forming the light-emitting layer according to the fifth embodiment.

FIG. 16 is a flowchart for describing the step of forming the light-emitting layer corresponding to a step of forming a quantum dot layer in the present embodiment. FIG. 17 is a graph for describing a relationship between an elapsed time and a temperature in the step of forming the light-emitting layer. Similar to FIG. 15, a solid line in FIG. 16 indicates a temperature of a core 22 on an array substrate 3, and a broken line indicates a temperature around the core 22.

In the step of forming the light-emitting layer according to the present embodiment, the same method as that described in the previous embodiment is performed from step S10 to step S13B. At the point in time of the completion of step S13B, a first quantum dot 20, a second quantum dot 17, and a ligand 18 are formed in an upper layer relative to a first charge transport layer 6, as illustrated in FIG. 11A.

In the present embodiment, subsequent to step S13B, a step of third heating is performed in such a manner that third light irradiation is additionally performed to heat the first quantum dots 20 so that the temperature of the first quantum dots 20 becomes a temperature equal to or higher than a third temperature T3$a$ (step S14B). In the third light irradiation, ultraviolet light may be emitted as in a step of first heating by light irradiation and a step of second heating by light irradiation, or light having a larger amount of energy per unit time than the light emitted in second light irradiation may be emitted. The third temperature T3$a$ is higher than a second temperature T2$a$, and is equivalent to a boiling point of the ligand 18. For example, in the case where the ligand 18 is the aforementioned TOPO, the third temperature T3$a$ is 411.2 degrees Celsius. Note that, by performing the step of the temperature lowering (step S13A (FIG. 3)) after the step of the second heating (step S13B) and before the step of the third heating (step S14B), the ligand 18 may be cured in a layered manner.

When an ambient temperature of the first quantum dots 20 reaches the third temperature T3$a$ by heating the first quantum dots 20 in the step of the third heating, vaporization of the ligand 18 begins and the ambient temperature of the first quantum dots 20 maintains the third temperature T3$a$ for a while. Thus, in the step of the third heating, the ligand 18 vaporizes as illustrated in FIG. 11B.

Subsequent to step S14B, the light irradiation is stopped and a step of second temperature lowering is performed in which the temperature of the first quantum dots 20 is reduced to a temperature equal to or lower than the third temperature T3$a$ (step S15B).

In the present embodiment, by the step of the second temperature lowering, the cooling is performed until the temperature of the first quantum dots 20 becomes a temperature TCa, which is lower than a temperature TAa. The temperature TCa may be higher than a temperature T0 or may be equal to the temperature T0. When the temperature of the first quantum dots 20 drops, the temperature around the first quantum dots 20 also drops. At the point in time of the completion of the step of the second temperature lowering, the plurality of first quantum dots 20 are formed in the layered manner in an upper layer relative to the first charge transport layer 6, as illustrated in FIG. 11B.

After the temperature of the first quantum dots 20 has reached the temperature TCa by the step of the second temperature lowering, a step of second application is performed in which a second solution 40 is applied on a position overlapping with the array substrate 3 as illustrated in FIG. 11C (step S16B).

Subsequently, a step of fourth heating is performed in which fourth light irradiation is performed to irradiate a second solvent 42 on the array substrate 3 with ultraviolet light so as to heat the first quantum dots 20 again (step S17B). In the step of the fourth heating, the first quantum dots 20 are heated until the first quantum dots 20 have a fourth temperature T4$a$ or higher as indicated in FIG. 17.

The fourth temperature T4$a$ is the higher temperature of a melting point of an organic material 44 and a boiling point of the second solvent 42. A temperature TDa indicated in FIG. 17 is the lower temperature of the melting point of the organic material 44 and the boiling point of the second solvent 42. The fourth temperature T4$a$ and the temperature TDa are higher than the temperature T0. The fourth temperature T4$a$ may be equal to a first temperature T1$a$, and the temperature TDa may be equal to the temperature TAa.

The ambient temperature of the first quantum dots 20 follows a rise of the temperature of the first quantum dots 20 with a slight delay, as illustrated in FIG. 17, until the temperature of the first quantum dots 20 rises from the temperature T0 to the temperature TDa. However, when the ambient temperature of the first quantum dots 20 rises up to the temperature TDa and one of the melting of the organic material 44 and the evaporation of the second solvent 42 begins, the ambient temperature of the first quantum dots 20 maintains the temperature TDa for a while.

By further carrying on the fourth light irradiation, one of the melting of the organic material 44 and the evaporation of the second solvent 42 ends, and the ambient temperature of the first quantum dots 20 begins to rise again. Then, when the ambient temperature of the first quantum dots 20 rises up to the fourth temperature T4$a$ and the other one of the melting of the organic material 44 and the evaporation of the second solvent 42 begins, the ambient temperature of the first quantum dots 20 maintains the fourth temperature T4$a$ for a while.

Thus, by the step of the fourth heating, the melting of the organic material 44 and the evaporation of the second solvent 42 are completed. After the completion of the step of the fourth heating, as illustrated in FIG. 12A, the second solvent 42 has vaporized from above the array substrate 3, and a second inorganic precursor 46 is dispersed in the periphery of the first quantum dots 20 in the melted organic material 44. The second inorganic precursor 46 is also dispersed in a gap between the first quantum dots 20.

Subsequently, a step of fifth heating is performed in which fifth light irradiation is performed on the position where the second solvent 42 has been applied on the array substrate 3 so as to heat the first quantum dots 20 (step S18B). In the step of the fifth heating, the fifth light irradiation is continued until the temperature of the first quantum dots 20 reaches a fifth temperature T5a indicated in FIG. 17. In the fifth light irradiation, ultraviolet light may be emitted as in the fourth light irradiation, or ultraviolet light having a larger amount of energy per unit time than the ultraviolet light emitted in the fourth light irradiation may be emitted. The fourth light irradiation and the fifth light irradiation may be performed continuously.

Subsequently, from the point in time when the temperature of the first quantum dots 20 reaches the fifth temperature T5a, a step of temperature maintaining is performed in which the light irradiation is performed to maintain the temperature of the first quantum dots 20 at approximately the fifth temperature T5a (step S19B). In the light irradiation in the step of the temperature maintaining, ultraviolet light may be emitted as in the fourth light irradiation and the fifth light irradiation, or ultraviolet light having a smaller amount of energy per unit time than the ultraviolet light emitted in the fifth light irradiation may be emitted. Since the temperature of the first quantum dots 20 is maintained at the fifth temperature T5a in the step of the temperature maintaining, the ambient temperature of the first quantum dots 20 after having reached the fifth temperature T5a is also maintained at the fifth temperature T5a.

The fifth temperature T5a is higher than the fourth temperature T4a, and is a temperature at which the second inorganic precursor 46 epitaxially grows around a first shell 24 by thermochemical reaction. Thus, while the ambient temperature of the first quantum dots 20 is maintained at the fifth temperature T5a, the second inorganic precursor 46 gradually grows epitaxially around the first shell 24. With this, as illustrated in FIG. 12B, a gap between the first shells 24 of adjacent first quantum dots 20 is filled to form a shell layer 24A in which each of the first shells 24 is connected in the layered manner.

As described above, as illustrated in FIG. 12B, the layer including the core 22 and the shell layer 24A is formed. Note that, in the step of the temperature maintaining, by forming the shell layer 24A, the melted organic material 44 is pushed up to an upper layer of the shell layer 24A, whereby the organic material 44 remains in the upper layer relative to the shell layer 24A.

Subsequently, a step of sixth heating is performed in which sixth light irradiation is additionally performed to heat the first quantum dots 20 so that the temperature of the first quantum dots 20 becomes a sixth temperature T6a or higher (step S20B). In the sixth light irradiation, ultraviolet light may be emitted as in the fourth light irradiation, the fifth light irradiation, and the light irradiation in the step of the temperature maintaining, or light having a larger amount of energy per unit time than the light emitted in the light irradiation in the step of the temperature maintaining may be emitted. The sixth temperature T6a is higher than the fifth temperature T5a, and is equivalent to the boiling point of the organic material 44.

When the ambient temperature of the first quantum dots 20 reaches the sixth temperature T6a by heating the first quantum dots 20 in the step of the sixth heating, evaporation of the organic material 44 begins and the ambient temperature of the first quantum dots 20 maintains the sixth temperature T6a for a while. With this, in the step of the sixth heating, the organic material 44 vaporizes, and as illustrated in FIG. 13, the organic material 44 is removed. As described above, the step of forming the light-emitting layer in the present embodiment is completed.

In the present embodiment, after the step of the second heating by the light irradiation is performed, the step of the third heating by the light irradiation may be omitted, and the step of the second temperature lowering and subsequent steps may be performed sequentially. That is, the vaporization of the ligand 18 and the vaporization of the organic material 44 may be performed collectively in the step of the sixth heating by the light irradiation. This decreases the number of steps of the light irradiation, which leads to a reduction in tact time and a reduction in manufacturing cost.

In the present embodiment, although not limited thereto, the step of forming the light-emitting layer is described in the case where the fourth temperature T4a is equal to the first temperature T1a, the fifth temperature T5a is equal to the second temperature T2a, and the sixth temperature T6a is equal to the third temperature T3a. Such a configuration may be realized simply and easily by making the first solvent 32 and the second solvent 42 be the same, the material of the ligand 18 and the organic material 44 be the same, and the first inorganic precursor 30 and the second inorganic precursor 46 be the same.

With this, the temperature as the heating reference for each light irradiation may be adjusted between the steps from the first heating to third heating and the steps from the fourth heating to sixth heating. Accordingly, the configuration described above leads to a simplification of the entire step of forming the light-emitting layer.

Further, instead of performing heating by light irradiation in at least any one of the step of the first heating to the step of the sixth heating (step S11B, S13B, S14B, and S17B to S20B illustrated in FIG. 16), the array substrate 3 may be heated by heating the atmosphere around the array substrate 3 by setting the array substrate 3 in a furnace or the like.

Modified Example

In each of the embodiments described above, a case has been described in which the quantum dot layer including the first quantum dots 20 is the light-emitting layer 8. However, no such limitation is intended, and the first charge transport layer 6 or the second charge transport layer 10 may be the quantum dot layer including the first quantum dots 20, for example. In this manner, in the case where each charge transport layer includes the first quantum dots 20, these first quantum dots 20 may be provided with a function to transport carriers. In this case, in comparison with a charge transport layer including known quantum dots, the stability of the first quantum dots 20 in each charge transport layer is improved, so that the efficiency of carrier transport in each of the charge transport layers is improved, leading to an improvement in the luminous efficiency of the light-emitting device 1. Each of the charge transport layers including the first quantum dots 20 described above may also be formed by the same technique as the step of forming the quantum dot layer in each of the embodiments.

In each of the above-described embodiments, a display device including a plurality of light-emitting elements and having the light-emitting face DS is exemplified to describe the configuration of the light-emitting device 1. However, the disclosure is not limited thereto, and the light-emitting device 1 in each of the embodiments described above may be a light-emitting device including a single light-emitting element.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A method for manufacturing a quantum dot layer, the method comprising:
applying, on a position overlapping with a substrate, a first solution comprising: a plurality of particles, each of which including a first core and a first ligand coordinating with the first core, a first inorganic precursor, and a first solvent;
heating, after applying the first solution, the first ligand and the first solvent to a first temperature or higher, the first temperature being a higher temperature among a melting point of the first ligand and a boiling point of the first solvent; and
heating, after heating the first ligand and the first solvent, the first inorganic precursor to a second temperature, the second temperature being higher than the first temperature and being a temperature, at which the first inorganic precursor epitaxially grows around the first core and at which a first shell configured to coat the first core is formed to form a plurality of first quantum dots, wherein
the first inorganic precursor is heated to form the plurality of first quantum dots in the quantum dot layer, and to form a plurality of second quantum dots, each of which including, in a second core, a same material as the first shell.

2. The method for manufacturing the quantum dot layer according to claim 1, wherein
the first ligand and the first solvent are heated by increasing an atmospheric temperature around the substrate.

3. The method for manufacturing the quantum dot layer according to claim 1, wherein
the first ligand and the first solvent are heated by irradiating the first core with light and causing the first core to generate heat.

4. The method for manufacturing the quantum dot layer according to claim 1, wherein
the first inorganic precursor is heated by increasing an atmospheric temperature around the substrate.

5. The method for manufacturing the quantum dot layer according to claim 1, wherein
the first inorganic precursor is heated by irradiating the first core with light and causing the first core to generate heat.

6. The method for manufacturing the quantum dot layer according to claim 1,
wherein each of the plurality of first quantum dots and each of the plurality of second quantum dots are separated from each other.

7. The method for manufacturing the quantum dot layer according to claim 1,
wherein first quantum dots, among the plurality of first quantum dots, that are adjacent to each other are separated from each other.

8. The method for manufacturing the quantum dot layer according to claim 1,
wherein each of the plurality of second quantum dots is formed by using a semiconductor material having a band gap equal to or greater than 3.1 eV.

9. The method for manufacturing the quantum dot layer according to claim 1,
wherein each of the plurality of second quantum dots is formed by using a semiconductor material having a band gap less than 3.1 eV, and has a particle diameter having a light emission wavelength equal to or less than 400 nm.

10. The method for manufacturing the quantum dot layer according to claim 1, further comprising:
between heating the first ligand and the first solvent and heating the first inorganic precursor, lowering a temperature of the first ligand to a melting point or lower.

11. The method for manufacturing the quantum dot layer according to claim 1, further comprising:
after heating the first inorganic precursor, lowering a temperature of the first ligand to a melting point or lower to form the first ligand in a layered manner.

12. The method for manufacturing the quantum dot layer according to claim 1, further comprising:
after heating the first inorganic precursor, heating the first ligand to a third temperature, being a boiling point of the first ligand, to vaporize the first ligand.

13. The method for manufacturing the quantum dot layer according to claim 12, further comprising:
after heating the first ligand to the third temperature, applying, on another position overlapping with the substrate, a second solution comprising: a second inorganic precursor, a second ligand, and a second solvent;
after applying the second solution, heating the second ligand and the second solvent to a fourth temperature or higher, the fourth temperature being a higher temperature among a melting point of the second ligand and a boiling point of the second solvent;
providing a plurality of first shells, including the first shell;
after heating the second ligand and the second solvent, heating the second inorganic precursor to a fifth temperature, the fifth temperature being higher than the fourth temperature, and being a temperature at which the second inorganic precursor epitaxially grows around the first shell to fill at least a part of a void between the plurality of first shells; and
after heating the second inorganic precursor, heating the second ligand to a sixth temperature, being a boiling point of the second ligand, to vaporize the second ligand.

14. A method for manufacturing a light-emitting device, the method comprising:
forming a first electrode;
forming the quantum dot layer, by the method of claim 1, overlapping the first electrode; and
forming a second electrode overlapping the first electrode via the quantum dot layer.

* * * * *